US012712336B2

(12) United States Patent
Li

(10) Patent No.: US 12,712,336 B2
(45) Date of Patent: Aug. 18, 2026

(54) CALIBRATION APPARATUS, LASER BEAM EMISSION CIRCUIT AND ELECTRONIC DEVICE

(71) Applicant: SUTENG INNOVATION TECHNOLOGY CO., LTD., Shenzhen (CN)

(72) Inventor: Yanmin Li, Shenzhen (CN)

(73) Assignee: SUTENG INNOVATION TECHNOLOGY CO., LTD., Shenzhen (CN)

( * ) Notice: Subject to any disclaimer, the term of this patent is extended or adjusted under 35 U.S.C. 154(b) by 819 days.

(21) Appl. No.: 18/125,103

(22) Filed: Mar. 22, 2023

(65) Prior Publication Data

US 2023/0318260 A1 Oct. 5, 2023

(30) Foreign Application Priority Data

Mar. 30, 2022 (CN) ........................ 202210325782.0

(51) Int. Cl.
*H01S 5/0683* (2006.01)
*H01S 5/40* (2006.01)

(52) U.S. Cl.
CPC .......... *H01S 5/0683* (2013.01); *H01S 5/4025* (2013.01)

(58) Field of Classification Search
CPC ............................ H01S 5/0683; H01S 5/4025
See application file for complete search history.

(56) References Cited

U.S. PATENT DOCUMENTS 5,594,305 A * 1/1997 Primm .................... G09G 3/22 315/227 R
10,436,909 B2 * 10/2019 Ouyang ................ G01S 7/4808
2004/0036533 A1 * 2/2004 Mazda .................... H03F 1/305 330/251
2014/0198365 A1 * 7/2014 Li ......................... B33Y 30/00 359/201.2

(Continued)

FOREIGN PATENT DOCUMENTS

EP 1557786 A2 7/2005

OTHER PUBLICATIONS

First Office Action issued in related Chinese Application No. 202210325782.0, mailed Sep. 20, 2024, 16 pages.

(Continued)

*Primary Examiner* — M. A. Golub-Miller
(74) *Attorney, Agent, or Firm* — BAYES PLLC

(57) ABSTRACT

This application relates to a calibration apparatus, a laser beam emission circuit and an electronic device. The calibration apparatus is applied to the laser beam emission circuit, where the laser beam emission circuit includes N lasers, and the calibration apparatus includes: a detection module, configured to detect optical power of an $i^{th}$ laser; and a control module, configured to adjust an $i^{th}$ control signal based on a detection result of the detection module. The control module is further configured to establish a mapping relationship between the $i^{th}$ laser and the $i^{th}$ control signal when the $i^{th}$ optical power is equal to the target optical power.

3 Claims, 17 Drawing Sheets

(56) References Cited

U.S. PATENT DOCUMENTS

| | | | | |
|---|---|---|---|---|
| 2017/0301716 | A1* | 10/2017 | Irish | G01S 7/4863 |
| 2018/0301589 | A1* | 10/2018 | Burroughs | G01J 1/44 |
| 2020/0209355 | A1* | 7/2020 | Pacala | G01S 7/484 |
| 2020/0326425 | A1* | 10/2020 | Donovan | G01S 17/88 |
| 2021/0247499 | A1 | 8/2021 | Zhu et al. | |
| 2022/0075027 | A1* | 3/2022 | Kahana | G01S 17/89 |
| 2022/0299604 | A1* | 9/2022 | Dolganov | G01S 7/484 |
| 2023/0208099 | A1* | 6/2023 | Li | H01S 5/0428<br>372/38.02 |

OTHER PUBLICATIONS

European Search Report issued in related European Application No. 23165063.1, mailed Jul. 12, 2023, 9 pages.

* cited by examiner

CALIBRATION APPARATUS, LASER BEAM EMISSION CIRCUIT AND ELECTRONIC DEVICE

CROSS-REFERENCE TO RELATED APPLICATION

The present application claims the benefit of priority to Chinese Patent Application No. 202210325782.0, filed on Mar. 30, 2022, which is hereby incorporated by reference in its entirety.

TECHNICAL FIELD

This application relates to the technical field of laser beam emission, and in particular, to a calibration apparatus, a laser beam emission circuit, and an electronic device.

BACKGROUND

As LiDAR technologies evolve towards integration, laser arrays are increasingly commonly used in a LiDAR. However, due to process errors in manufacture of lasers, when selected for laser beam emission, multiple lasers in a laser beam emission circuit emit laser beams non-uniformly, and non-uniform laser beam emission of the multiple lasers, that is, different luminous power, causes different ranging capabilities of the multiple lasers within corresponding fields of view. Lasers with lower luminous power limit ranging capabilities of the LiDAR, which may cause distortion of point cloud images, thereby reducing detection accuracy of the LiDAR.

Therefore, how to improve laser beam emission uniformity of the laser array is a technical problem that needs to be solved by persons skilled in the art.

SUMMARY

To solve the problem in the related art, this application provides a calibration apparatus, a laser beam emission circuit, and an electronic device, so that optical power uniformity of multiple lasers can be improved.

A first aspect of this application provides a calibration apparatus, applied to a laser beam emission circuit, where the laser beam emission circuit includes N lasers, N is a positive integer, N is greater than or equal to 2, and the calibration apparatus includes:

- a detection module, configured to detect optical power of an $i^{th}$ laser; and
- a control module, configured to adjust an $i^{th}$ control signal based on a detection result of a detection module, so that $i^{th}$ optical power is equal to target optical power, where N≥i≥1, the $i^{th}$ control signal is used to control optical power of an $i^{th}$ laser during laser beam emission, and the $i^{th}$ optical power is optical power of the $i^{th}$ laser during laser beam emission, where
- the control module is further configured to establish a mapping relationship between the $i^{th}$ laser and the $i^{th}$ control signal when the $i^{th}$ optical power is equal to the target optical power.

A second aspect of this application provides a laser beam emission circuit, where the laser beam emission circuit includes N lasers, the laser beam emission circuit obtains an $i^{th}$ control signal in a one-to-one correspondence with an $i^{th}$ laser based on the mapping relationship provided by the foregoing calibration apparatus, so that optical power of the $i^{th}$ laser during laser beam emission is equal to target optical power, where N≥i≥1.

A third aspect of this application provides an electronic device, where the electronic device includes a laser beam emission circuit, the laser beam emission circuit includes N lasers, the electronic device also includes a main control unit, the main control unit is configured with a mapping relationship, the mapping relationship is used by the laser beam emission circuit to obtain an $i^{th}$ control signal in a one-to-one correspondence with an $i^{th}$ laser, and the $i^{th}$ control signal is used to control the $i^{th}$ laser to emit a laser beam, so that $i^{th}$ optical power when the $i^{th}$ laser emits the laser beam is equal to target optical power, where N≥i≥1.

A fourth aspect of this application provides a calibration method. The calibration method is applied to a laser beam emission circuit, the laser beam emission circuit uses N lasers to emit laser beams, and luminous power of the N lasers is controlled by using their respective control signals. The calibration method includes the following: detecting optical power of an $i^{th}$ laser, where i=1, 2, . . . , N; adjusting an $i^{th}$ control signal based on a detection result, so that $i^{th}$ optical power is equal to target optical power; and establishing a mapping relationship between the $i^{th}$ laser and the $i^{th}$ control signal when the $i^{th}$ optical power is equal to the target optical power.

A fifth aspect of this application provides a computer-readable storage medium storing executable code, where when the executable code is executed by a processor of an electronic device, the processor is enabled to perform the foregoing method.

A sixth aspect of this application provides a computer program product, including executable code, where when the executable code is executed, the foregoing method is implemented.

The technical solution provided in this application may have the following beneficial effects.

In the embodiments of this application, control signals of the N lasers can be calibrated in some embodiments of this application. For example, when the optical power of the $i^{th}$ laser reaches the target optical power, the mapping relationship may be established between the $i^{th}$ control signal of the $i^{th}$ laser and the $i^{th}$ laser. In this way, a user can determine the $i^{th}$ control signal corresponding to the $i^{th}$ laser in the N lasers based on the mapping relationship, so that optical power of each laser in the N lasers approaches or reaches the target optical power, thereby improving the optical power uniformity of the N lasers.

BRIEF DESCRIPTION OF DRAWINGS

Exemplary embodiments of this application are described more specifically with reference to the accompanying drawings, to more expressly illustrate the foregoing and other objectives, features and advantages of this application. In the exemplary embodiments of this application, the same reference numerals generally represent the same components.

DESCRIPTION OF THE DISCLOSURE

The following describes embodiments of this application more specifically with reference to the accompanying drawings. Although the embodiments of this application are shown in the accompanying drawings, it should be understood that this application may be implemented in various forms and should not be limited by the embodiments illustrated herein.

The terms used in the embodiments of this application are merely for the purpose of illustrating specific embodiments, but are not intended to limit this application. The terms "a/an" and "the" of singular forms used in this application and the appended claims are also intended to include plural forms, unless otherwise specified in the context clearly. It should be further understood that the term "and/or" used in this specification refers to any combination of one or more of the associated items listed and all possible combinations thereof.

It should be understood that although the terms "first," "second," third," and the like are used to describe various types of information in this application, the information should not be limited to these terms. The terms are only used to distinguish between information of the same type. For example, without departing from the scope of this application, first information may also be referred to as second information, and similarly, second information may also be referred to as first information. Therefore, a feature with a determiner such as "first" or "second" may expressly or implicitly include one or more features. In the description of this application, "multiple" means two or more, unless otherwise specifically defined.

The following describes in detail the technical solution in the embodiments of this application with reference to the accompanying drawings.

Figure 1:
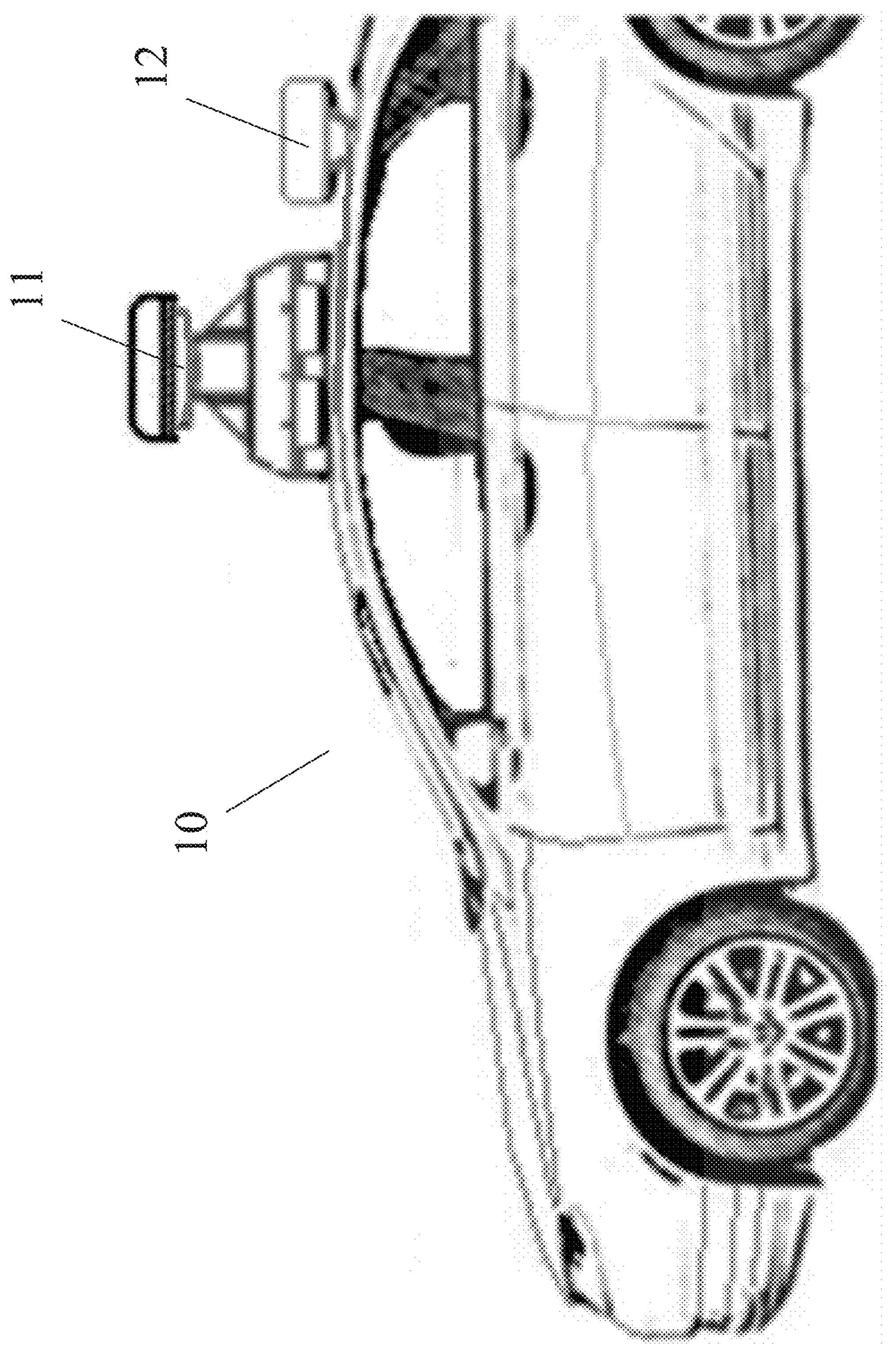
FIG. 1 is a schematic diagram of an application scenario of a calibration apparatus and an electronic device according to an embodiment of this application.

FIG. 1 is a schematic diagram of an application scenario of an electronic device (the electronic device may include a LiDAR) according to an embodiment of this application.

FIG. 1 shows hardware configuration of a vehicle 10 supporting a driving assistance function or an automated driving function. For example, at least one LiDAR (Laser Imaging Detection and Ranging) 11 is mounted on a roof and/or a side of the vehicle 10. A detection region of the LiDAR 11 may be unchanged. For example, one specific LiDAR 11 may be only configured to detect a specific preset region. The detection region of the LiDAR 11 can be adjusted. For example, the LiDAR on the vehicle can scan multiple detection regions by adjusting attitude, an angle of view range of the LiDAR or the like. Specifically, the vehicle 10 may be mounted with five LiDARs 11 on the roof, the front part, the rear part, the left part, and the right part of the vehicle. Multiple LiDARs 11 can detect an outline of an object in a region adjacent to the vehicle and a distance between the vehicle and the object, and the LiDARs 11 can be arranged based on an actual need. This application imposes no limitation on layout of the LiDARs 11.

As LiDAR technologies continuously develop, laser technologies evolve from integration of discrete single transistors into a one-dimensional array to further integration of one-dimensional arrays into a two-dimensional array. The laser arrays are also increasingly widely applied in electronic devices. However, in a manufacture process of lasers, due to many factors such as fluctuation of a manufacture environment, a process parameter, and purity of raw materials, the multiple lasers have different optical power under the same excitation condition. For example, the laser beam emission circuit includes multiple lasers (such as a laser array), there is a difference between the multiple lasers, and as a result, when the same emission power supply is configured to drive the multiple lasers to emit laser beams, certain pairs of the multiple lasers have different emission power. The foregoing phenomenon causes non-uniformity of luminous power in a laser beam emission circuit including multiple lasers.

To resolve the problem of non-uniformity of luminous power of multiple lasers, a first aspect of the embodiments of this application provides a calibration apparatus, the calibration apparatus is applied to an electronic device including a laser beam emission circuit, the laser beam emission circuit uses N lasers to emit laser beams, and luminous power of the N lasers is controlled by using their respective control signals; and the calibration apparatus provided in this application can calibrate the control signals of the N lasers in advance to improve optical power uniformity of the lasers, where N is a positive integer and N≥2.

It can be understood that the N lasers can be N independent laser beam sources, such as N LDs (laser diodes), or can also be N second laser units in one two-dimensional laser array. Each second laser unit includes multiple laser beam sources (such as multiple LDs). N second laser units can perform addressing and emit laser beams by regions under the drive of the addressable drive circuit, and the addressable drive circuit drives, through time-division, multiple laser beam sources (moment $t_{21}$) in a second laser unit 1, multiple laser beam sources (moment $t_{22}$) in a second laser unit 2, . . . , multiple laser beam sources (moment $t_{23}$) in the second laser unit N under the control of the addressing drive signal to emit laser beams. In this case, the calibration apparatus 300 calibrates optical power of the multiple second laser units in the two-dimensional laser array by regions, so that optical power of the multiple second laser units in different regions in the two-dimensional laser array is all equal to their respective target optical power. The N lasers can also be N first laser units in a one-dimensional laser array, each first laser unit includes multiple laser beam sources (such as multiple LDs), N first laser units can perform addressing and emit laser beams by regions under the drive of the addressable drive circuit, the addressable drive circuit drives, through time-division, multiple laser beam sources (moment $t_{11}$) in a first laser unit 1, multiple laser beam sources (moment $t_{12}$) in a first laser unit 2, . . . , multiple laser beam sources (moment $t_{13}$) in the first laser unit N under the control of the addressing drive signal to emit laser beams. In this case, the calibration apparatus 300 calibrates optical power of the multiple first laser units in the one-dimensional laser array by regions, so that optical power of the multiple first laser units in different regions in the one-dimensional laser array is all equal to their respective target optical power. This application imposes no limitation on a specific structure of the N lasers.

Preferably, the foregoing laser beam emission circuit can be applied to the electronic device using the laser beam for detection, and the laser beam emission circuit can include a laser array consisting of m×n lasers, that is, N=m*n, where m and n are positive integers, and N lasers are arranged in an array on a carrier (such as an emission board).

Figure 2:
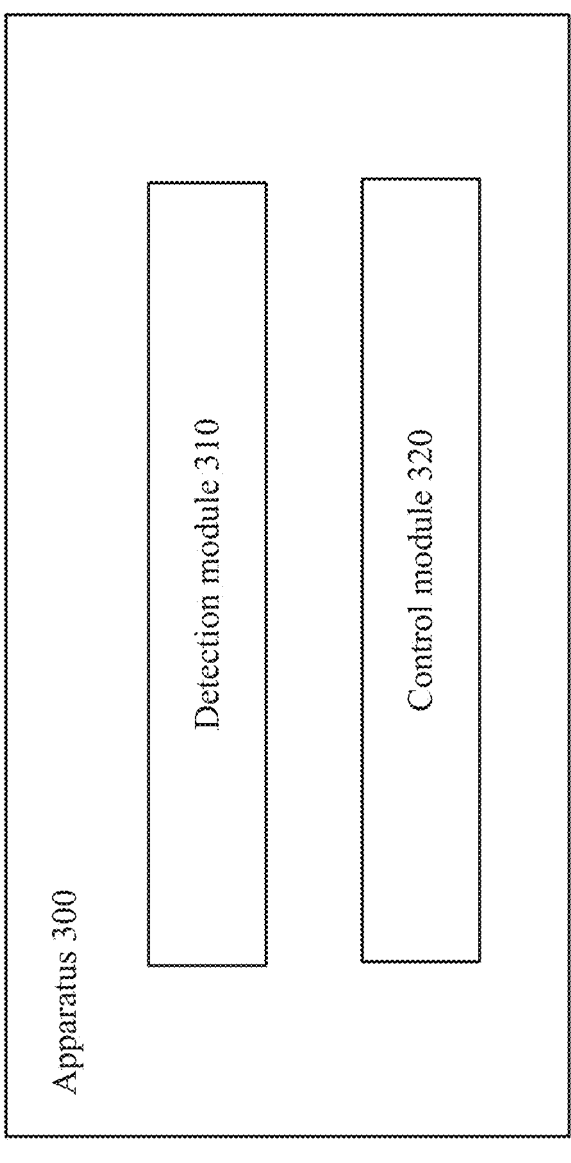
FIG. 2 is a block diagram of a calibration apparatus according to an embodiment of this application.

FIG. 2 is a block diagram of a calibration apparatus according to an embodiment of this application. Referring to FIG. 2, the calibration apparatus 300 includes a detection module 310 and a control module 320.

The detection module 310 is configured to detect optical power of N lasers. Specifically, the detection module 310 may use an optical power meter to detect the optical power when the multiple lasers emit laser beams.

The control module 320 is configured to adjust an $i^{th}$ control signal based on a detection result of the detection module 310, so that the $i^{th}$ optical power is equal to target optical power. Herein. N≥i≥1, and the $i^{th}$ control signal is used to control optical power of the $i^{th}$ laser when the $i^{th}$ laser emits a laser beam. The $i^{th}$ optical power is the optical power when the $i^{th}$ laser emits the laser beam. For example, for the $i^{th}$ control signal of the $i^{th}$ laser, when the optical power of the $i^{th}$ laser is less than the target optical power, the optical power of the $i^{th}$ laser can be increased by adjusting the $i^{th}$ control signal, so that the $i^{th}$ optical power is equal to the target optical power.

For example, when the optical power of the $i^{th}$ laser is greater than the target optical power, the optical power of the $i^{th}$ laser can be reduced by adjusting the $i^{th}$ control signal, so that the $i^{th}$ optical power is equal to the target optical power. The $i^{th}$ control signal can be a high-level or low-level signal. In a specific embodiment, the $i^{th}$ control signal may be a pulse signal, and the optical power of the laser is adjusted by controlling a pulse width of the pulse signal.

It should be noted that the foregoing expression "equal to" may include a meaning of strict equivalence or approximate equivalence. For example, the $i^{th}$ optical power may fall within a specific threshold range of the target optical power, and the threshold may be determined based on experience or a requirement of an application scenario. The specific threshold range of the target optical power is, for example, 95%~105% of the target optical power, 97%~103% of the target optical power, 99%~101% of the target optical power, or 99.8%~100.2% of the target optical power. By analogy, the following expression "equal to" has the same meaning.

In addition, the control module 320 is further configured to establish a mapping relationship between the $i^{th}$ laser and the $i^{th}$ control signal when the $i^{th}$ optical power is equal to the target optical power.

In this embodiment, an identifier of the $i^{th}$ laser and an identifier of the $i^{th}$ control signal may be stored in association. The identifier of the $i^{th}$ laser and a parameter of the $i^{th}$ control signal may be alternatively stored in association. In addition, information capable of representing the $i^{th}$ laser and information capable of representing the $i^{th}$ control signal may alternatively be stored in association.

In an exemplary embodiment, the laser beam emission circuit further includes at least one energy storage-adjustable charging circuit 110, and the N lasers emit laser beams by using the electric energy provided by the energy storage-adjustable charging circuit 110.

Herein, an energy storage value of the energy storage-adjustable charging circuit 110 determines emission optical power of the laser (referred to as optical power below). By adjusting the energy storage value of the energy storage-adjustable charging circuit 110 corresponding to the N lasers when the N lasers emit laser beams, optical power of the N lasers is made equal to the target optical power.

In this embodiment, the energy storage value of the energy storage-adjustable charging circuit 110 is controlled by using the charging control signal, and optical power of a specific laser is adjusted by adjusting the charging control signal. The calibration apparatus provided in this application can calibrate charging control signals corresponding to the N lasers, to improve optical power uniformity of the lasers. In this embodiment, an $i^{th}$ control signal is the $i^{th}$ charging control signal, and the $i^{th}$ charging control signal is used to control the energy storage-adjustable charging circuit 110 to store the $i^{th}$ electric energy. The $i^{th}$ electric energy is used to provide energy for the $i^{th}$ laser to emit a laser beam. The control module adjusts the $i^{th}$ electric energy by using the $i^{th}$ charging control signal, so that the $i^{th}$ optical power is equal to the target optical power. Herein, the energy storage-adjustable charging circuit 110 may use components such as a capacitor and an inductor to store the electric energy.

The following exemplarily describes the energy storage-adjustable charging circuit 110.

Figure 3:
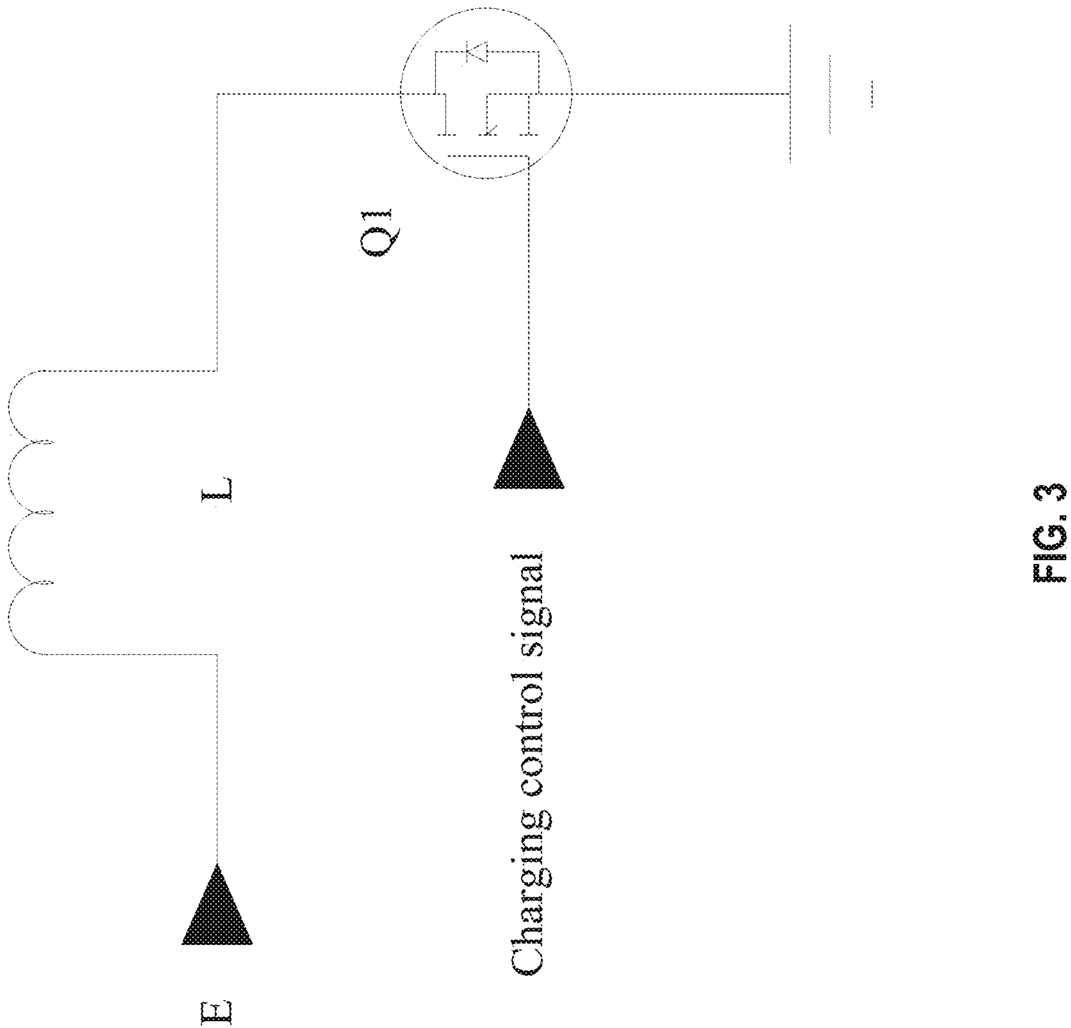
FIG. 3 is a diagram of a circuit structure of an energy storage-adjustable charging circuit according to an embodiment of this application.

FIG. 3 is a circuit diagram of an energy storage-adjustable charging circuit according to an embodiment of this application.

Referring to FIG. 3, the energy storage-adjustable charging circuit includes a charging switch element Q1 and a transitory energy storage element L. The charging switch element Q1 is connected between the emission power supply and the transitory energy storage element L. When the charging switch element Q1 is turned on, the transitory energy storage element L stores electric energy through the emission power supply. The charging switch element Q1 may be a MOS transistor, such as an NMOS transistor.

It should be noted that the transitory energy storage element L shown in FIG. 3 is only exemplary, and more transitory energy storage elements such as capacitive elements may also be included. Multiple transitory energy storage elements L may be respectively connected to an input end or an output end of the charging switch element Q1 in series. In addition, the multiple transitory energy storage elements L may be respectively connected to the input end and the output end of the charging switch element Q1 in series.

A first end of a transitory energy storage element L in FIG. 3 is connected to the emission power supply E and a second end is connected to a first end of a charging switch element and an end of an anode addressing driver.

The charging switch element Q1 includes a first end, a second end, and a charging enabling end, and receives a charging control signal output by a control module. The first end is connected to the second end of the transitory energy storage element L, the second end is grounded, and the charging enabling end is connected to the control module. The charging switch element Q1 is turned on or off under the control of the charging control signal, so that an energy storage value of the transitory energy storage element L is adjustable.

In a specific embodiment, the charging switch element Q1 is an NMOS transistor, a drain of the NMOS transistor serves as the first end of the charging switch element Q1 to be connected to the second end of the transitory energy storage element L. A source of the NMOS transistor serves as a second end of the charging switch element Q1 to be grounded, and a gate of the NMOS transistor is the charging enabling end for receiving the charging control signal. The NMOS transistor is turned on or off under the control of the charging control signal.

In this embodiment, the emission power supply E is connected to the energy storage-adjustable charging circuit, to charge the energy storage-adjustable charging circuit. A value of the output current of the energy storage-adjustable charging circuit is positively correlated with the energy stored in the transitory energy storage element L in the energy storage-adjustable charging circuit. When the optical power of the $i^{th}$ laser needs to be increased, the turn-on time of the charging switch element Q1 can be increased by using the $i^{th}$ charging control signal, to increase the energy stored in the transitory energy storage element L and further increase a charging current output by the transitory energy storage element L to the anode energy storage element, thereby adjusting the optical power of the laser by using the anode energy storage element.

In this embodiment, the $i^{th}$ charging control signal is used to turn on or off the charging switch element Q1. When the charging switch element Q1 is turned on, the emission power supply E, the transitory energy storage element L, the charging switch element Q1, and the ground form a first charging loop. The transitory energy storage element L stores electric energy through an output current of the emission power supply E. and when the charging switch element Q1 is turned off, the transitory energy storage element L stops storing the electric energy.

Herein, the control module 320 adjusts turn-on duration of the charging switch element Q1 by using the $i^{th}$ charging control signal, and further adjusts an energy value of the $i^{th}$ electric energy, so that the $i^{th}$ optical power is equal to the target optical power. For example, the $i^{th}$ charging control signal controls the turn-on time of the charging switch element Q1, to control energy storage value of the energy storage-adjustable charging circuit 110. Herein, the energy storage value of the energy storage-adjustable charging circuit 110 is positively correlated with the turn-on duration of the charging switch element Q1.

In some embodiments, the $i^{th}$ charging control signal is a pulse signal, and the turn-on duration of the charging switch element Q1 is related to a pulse width of the $i^{th}$ charging control signal. For example, the turn-on duration of the charging switch element is positively related to the pulse width of the charging control signal. It can be understood that the wider the pulse width, the higher the duty ratio, and the longer the turn-on duration of a specific type of charging switch element Q1.

In some embodiments, the mapping relationship established by the control module 320 is a mapping relationship between the $i^{t}$ laser and a pulse width of the $i^{th}$ charging control signal, and the energy storage-adjustable charging circuit 110 obtains the $i^{th}$ charging control signal in a one-to-one correspondence with the $i^{th}$ laser when the $i^{th}$ laser is selected for laser beam emission, so that the $i^{th}$ optical power is equal to the target optical power. For example, the mapping relationship can be expressed in a form of a key-value pair, a table, a mathematical model, or the like. The pulse width can be expressed by duration, and a unit of duration can be microsecond, millisecond, or the like. For example, a specific type of charging control signal can be characterized by a specific preset signal identifier, to determine the $i^{th}$ charging control signal corresponding to a specific pulse width.

In some embodiments, the control module 320 is further configured to generate a pulse parameter configuration table based on the mapping relationship and the pulse width, and the laser beam emission circuit generates the $i^{th}$ control signal in a one-to-one correspondence with the $i^{th}$ laser based on the pulse parameter configuration table, so that the $i^{th}$ optical power is equal to the target optical power.

For example, pulse widths for determining multiple charging control signals are stored in the pulse parameter configuration table. The electronic device can configure the pulse width of the charging control signal based on the parameter configuration table, to output the $i^{th}$ charging control signal in a one-to-one correspondence with the $i^{th}$ laser to the energy storage-adjustable charging circuit 110.

In some embodiments, the N lasers are disposed in an array. A same row of multiple lasers in the N lasers are connected through a shared anode end, and multiple rows of lasers are connected to the energy storage-adjustable charging circuit 110 respectively through the shared anode ends in a one-to-one correspondence with the multiple rows of laser. The energy storage-adjustable charging circuit 110 is configured to provide electric energy for the laser selected for laser beam emission. The energy storage-adjustable charging circuit 110 stores $i^{th}$ electric energy in a one-to-one correspondence with the $i^{th}$ laser for the $i^{th}$ laser based on the mapping relationship, so that the $i^{th}$ optical power is equal to the target optical power.

Figure 4:
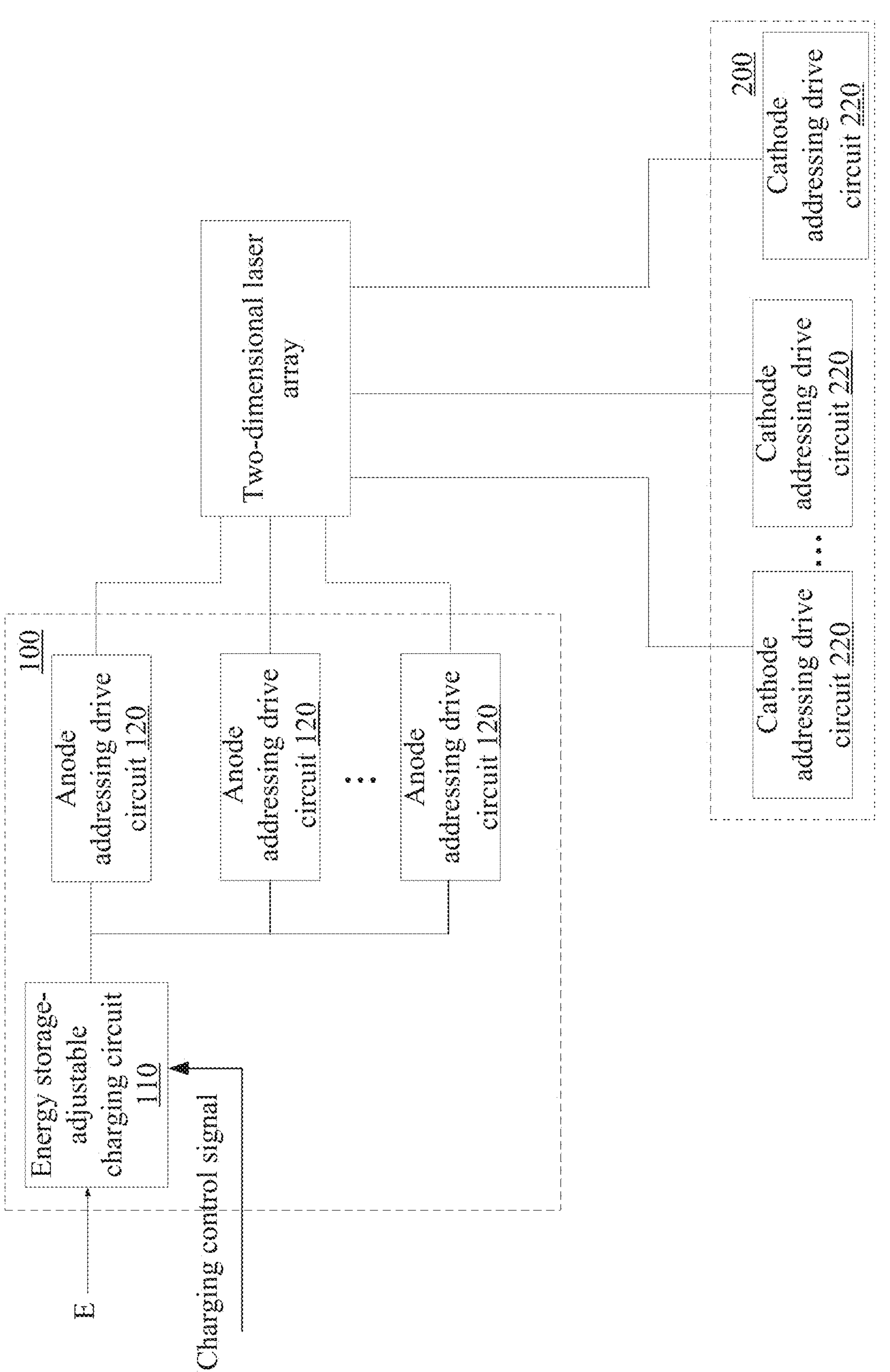
FIG. 4 is a diagram of a circuit structure of a laser beam emission circuit according to an embodiment of this application.
Figure 5:
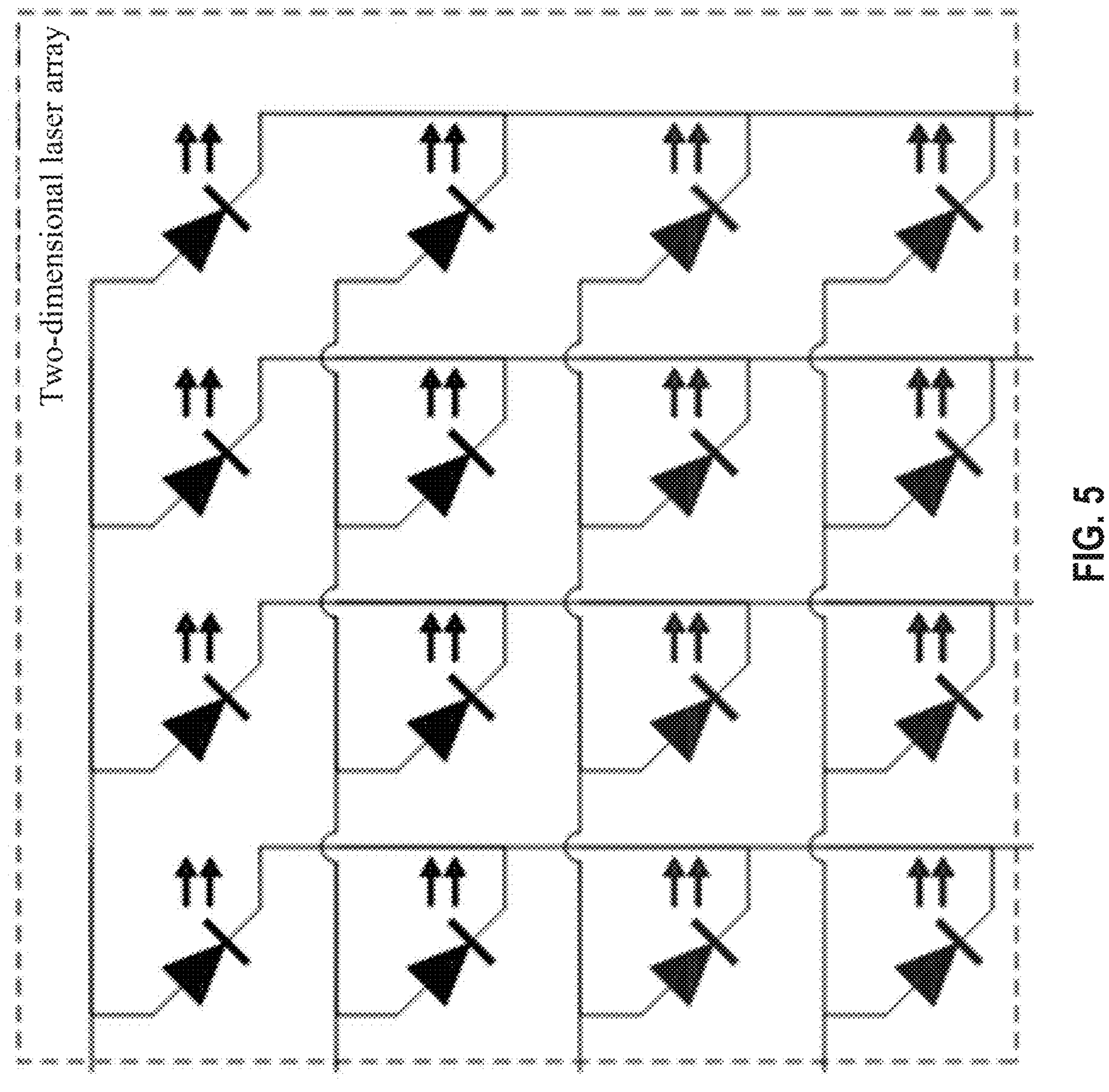
FIG. 5 is a diagram of a circuit structure of a two-dimensional laser array according to an embodiment of this application.

As shown in FIG. 4 and FIG. 5, taking a two-dimensional laser array as an example, N lasers are arranged into a two-dimensional array, the laser beam emission circuit includes the two-dimensional laser array consisting of N lasers and an addressable drive circuit of the laser array, and the addressable drive circuit of the laser array externally receives an addressing drive signal, and drives addressing for multiple lasers in the laser array through scanning to emit laser beams.

Specifically, anodes of lasers in the same row in the two-dimensional laser array are electrically connected and extend to form a shared anode end, and cathodes of the lasers in the same column in the two-dimensional laser array are electrically connected and extend to form a shared cathode end. The addressable drive circuit of the laser array includes an anode addressable drive circuit 100 and a cathode addressable drive circuit 200. The anode addressable drive circuit 100 includes the foregoing energy storage-adjustable charging circuit 110 and multiple anode addressing drive circuits 120. The cathode addressable drive circuit includes multiple cathode addressing drive circuits 220. The multiple anode addressing drive circuits 120 are connected one-to-one to multiple shared anode ends corresponding to the multiple rows of lasers, and the multiple anode addressing drive circuits 120 externally receive an anode addressing signal, to drive anode addressing for the anodes of the multiple rows of lasers through scanning; and the multiple cathode addressing drive circuits 220 are connected one-to-one to the multiple shared cathode ends corresponding to the multiple columns of lasers, and then the multiple cathode addressing drive circuits 220 externally receive a cathode addressing signal, to drive cathode addressing for the cathodes of the multiple columns of lasers in the laser array through scanning.

As shown in FIG. 4, the energy storage-adjustable charging circuit 110 is connected to the emission power supply E and the multiple anode addressing drive circuits 120, stores electric energy through the output current of the emission power supply E, and outputs a charging current with an adjustable value to the anode addressing drive circuit 120 in the turn-on state. An $x^{th}$ anode addressing drive circuit 120 is connected to the anode of the laser LDxy in the laser array through the shared anode end connected in a one-to-one correspondence, where x represents a specific row of lasers, x is a positive integer, x=1, 2, . . . , m, and m is the total number of anode addressing drive circuits 120 and also the total number of shared anode ends, and y represents a specific column of lasers, y is a positive integer, y=1, 2, . . . , n, and n is the total number of cathode addressing drive circuits 220 and also the total number of shared cathode ends.

In this embodiment, in the anode addressable drive circuit 100, a charging current with an adjustable value is output to the anode addressing drive circuit 120 in the turn-on state through the energy storage-adjustable charging circuit 110, to adjust the current output by the anode addressing drive circuit 120 to the laser, so that the optical power of the laser in the two-directional laser array is equal to the target optical power.

It should be noted that the foregoing two-dimensional laser array is only exemplary, and should not be understood as a limitation on the applicable scope of this application. For example, the technical solution of this application may alternatively be applied to, for example, multiple lasers arranged into a circle, a line, or an irregular shape.

Figure 6:
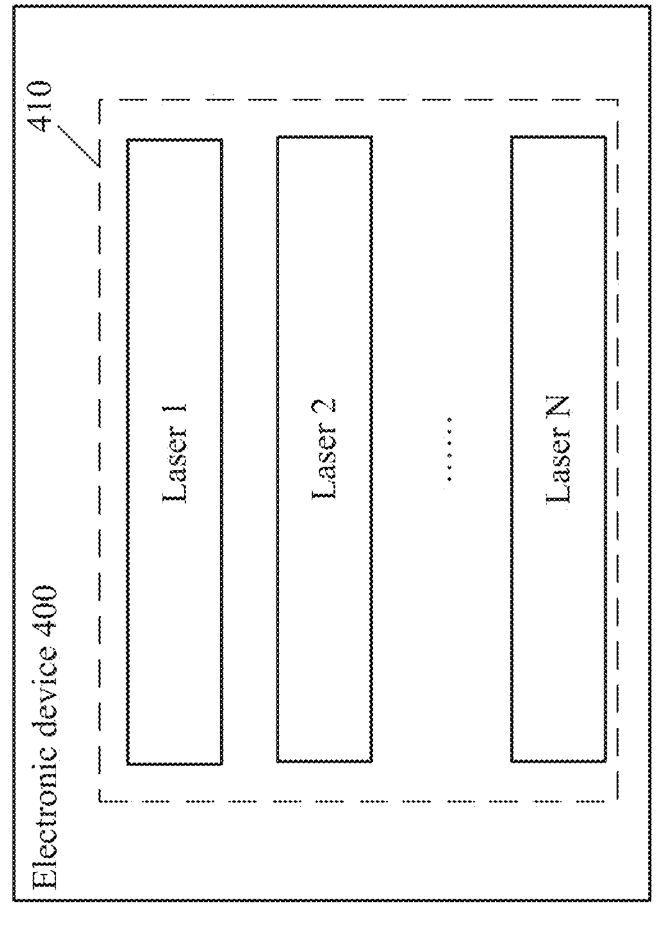
FIG. 6 is a structural block diagram of an electronic device according to an embodiment of this application.

A second aspect of the embodiments of this application also provides an electronic device 400. Referring to FIG. 6, the electronic device 400 includes a laser beam emission circuit 410, and the laser beam emission circuit 410 includes N lasers: laser 1 to laser N. Herein, the N lasers can obtain control signals in a one-to-one correspondence with the N lasers based on the foregoing mapping relationship provided by the calibration apparatus 300, so that the optical power of the N lasers is equal to the target optical power.

Specifically, an $i^{th}$ laser can obtain an $i^{th}$ control signal in a one-to-one correspondence with the $i^{th}$ laser based on the foregoing mapping relationship provided by the calibration apparatus 300, so that the optical power of the $i^{th}$ laser when the N lasers emit laser beams is equal to the target optical power, where i is a positive integer and N≥i≥1.

In this embodiment, each laser can determine the required $i^{th}$ control signal based on a laser identifier of the laser and the foregoing mapping relationship, so that the optical power of each laser corresponding to the $i^{th}$ control signal is the same as the target optical power.

Herein, the $i^{th}$ control signal may directly act on the $i^{th}$ laser to drive the $i^{th}$ laser to emit a laser beam. For example, the $i^{th}$ laser can be individually controlled to emit a laser beam through time-division. For example, the N lasers can be independently controlled based on the control signal. In addition, the $i^{th}$ control signal can also control the power supply circuit to provide electric energy to the $i^{th}$ laser, to drive the $i^{th}$ laser to emit a laser beam. For example, the N lasers can be controlled by the same power supply circuit. In this embodiment, optical power uniformity of the multiple lasers can be improved based on a calibration result (for example, the foregoing mapping relationship).

Figure 7:
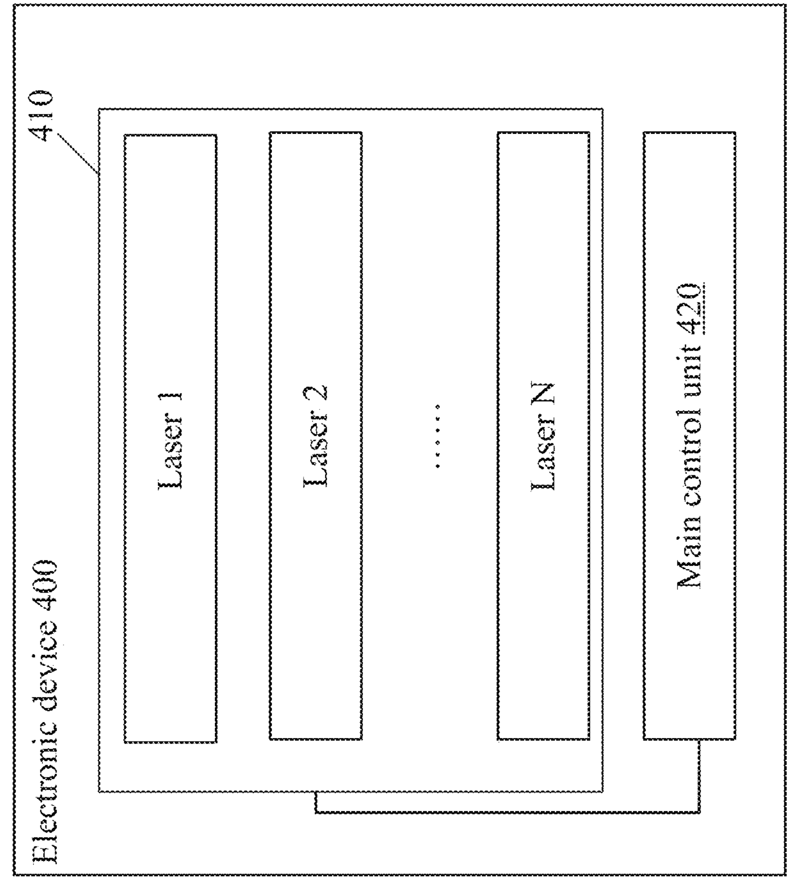
FIG. 7 is another structural block diagram of an electronic device according to an embodiment of this application.

FIG. 7 is another block diagram of an electronic device according to an embodiment of this application.

Referring to FIG. 7, the electronic device 400 includes a laser beam emission circuit 410 and a main control unit 420, and the laser beam emission circuit 410 includes N lasers: laser 1 to laser N. The main control unit 420 is configured with the mapping relationship provided by the foregoing calibration apparatus 300, and generates control signals in a one-to-one correspondence with the N lasers based on the mapping relationship. Optical power of the N lasers and the target optical power can be equalized under the control of the control signals in a one-to-one correspondence with the N lasers. For example, the $i^{th}$ control signal is used to control optical power of the $i^{th}$ laser when the $i^{th}$ laser emits a laser beam, so that the $i^{th}$ optical power of the $i^{th}$ laser during laser beam emission is equal to the target optical power, where N≥i≥1, and N is an integer greater than 1.

Figure 8:
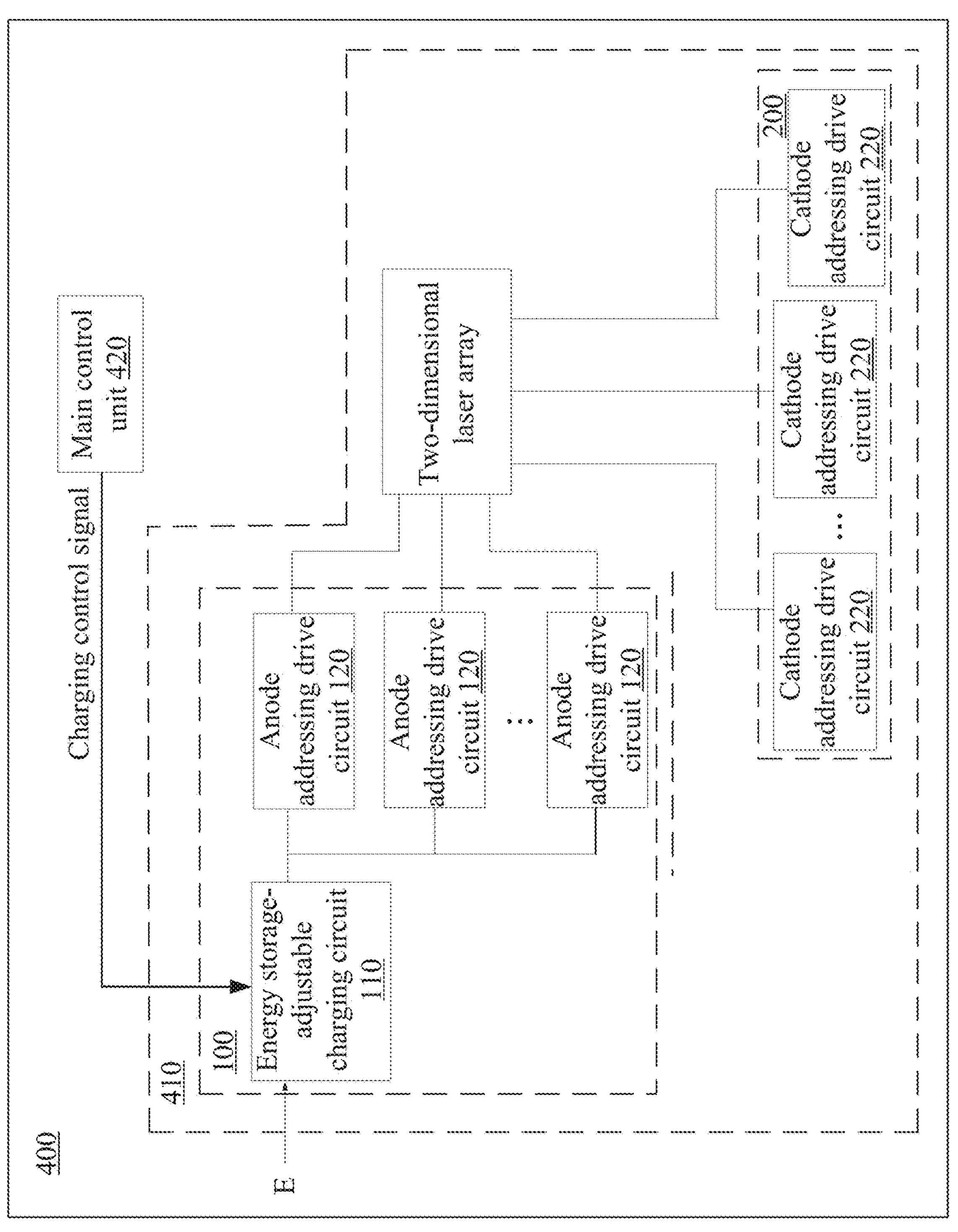
FIG. 8 is another structural block diagram of an electronic device according to an embodiment of this application.

FIG. 8 is another block diagram of an electronic device according to an embodiment of this application.

Referring to FIG. 8, the electronic device 400 includes a laser beam emission circuit 410 and a main control unit 420. The laser beam emission circuit 410 includes a two-dimensional laser array consisting of N lasers and the addressable drive circuit of the laser array. The addressable drive circuit of the laser array externally receives an addressing drive signal, and multiple lasers in the laser array are driven by scanning to perform addressing to emit laser beams. The main control unit 420 is configured with the mapping relationship provided by the foregoing calibration apparatus 300, and generates control signals in a one-to-one correspondence with the N lasers based on the mapping relationship; and optical power of the N lasers and the target optical power are equalized under the control of the control signals in a one-to-one correspondence with the N lasers.

Specifically, anodes of lasers in the same row in the two-dimensional laser array are electrically connected and extend to form a shared anode end, and cathodes of the lasers in the same column in the two-dimensional laser array are electrically connected and extend to form a shared cathode end. As shown in FIG. 8, the addressable drive circuit of the laser array includes an anode addressable drive circuit 100 and a cathode addressable drive circuit 200. The anode addressable drive circuit 100 includes the foregoing energy storage-adjustable charging circuit 110 and multiple anode addressing drive circuits 120. The cathode addressable drive circuit includes multiple cathode addressing drive circuits 220. The multiple anode addressing drive circuits 120 are connected one-to-one to multiple shared anode ends corresponding to the multiple rows of lasers, and the multiple anode addressing drive circuits 120 externally receive an anode addressing signal, to drive anode addressing for the anodes of the multiple rows of lasers through scanning; and the multiple cathode addressing drive circuits 220 are connected one-to-one to the multiple shared cathode ends corresponding to the multiple columns of lasers, and then the multiple cathode addressing drive circuits 220 externally receive a cathode addressing signal, to drive cathode addressing for the cathodes of the multiple columns of lasers in the laser array through scanning.

In this embodiment, in the anode addressable drive circuit 100, a charging current with an adjustable value is output to the anode addressing drive circuit 120 in the turn-on state through the energy storage-adjustable charging circuit 110, to adjust the current output by the anode addressing drive circuit 120 to the laser, so that the optical power of the laser in the two-directional laser array is equal to the target optical power. In this embodiment, the N lasers emit the laser beams by using the electric energy provided by the energy storage-adjustable charging circuit 110. Herein, an energy storage value of the energy storage-adjustable charging circuit 110 determines optical power of the laser. By adjusting the energy storage value of the energy storage-adjustable charging circuit 110 corresponding to the N lasers when the N lasers emit laser beams, optical power of the N lasers is made equal to the target optical power.

Further, the energy storage value of the energy storage-adjustable charging circuit 110 is controlled by using the charging control signal, and optical power of a specific laser is adjusted by adjusting the charging control signal. The main control unit 420 in the foregoing electronic device 400 is configured with the mapping relationship provided by the foregoing calibration apparatus 300, and generates charging control signals in a one-to-one correspondence with the N lasers based on the mapping relationship. Optical power of the N lasers and the target optical power can be equalized under the control of the charging control signals in a one-to-one correspondence with the N lasers, to improve optical power uniformity of the N lasers.

In this embodiment, an $i^{th}$ control signal is the $i^{th}$ charging control signal, and the $i^{th}$ charging control signal is used to control the energy storage-adjustable charging circuit 110 to store the $i^{th}$ electric energy. The $i^{th}$ electric energy is used to provide energy for the $i^{th}$ laser to emit a laser beam. The main control unit 420 adjusts the $i^{th}$ electric energy by using the $i^{th}$ charging control signal, so that the $i^{th}$ optical power is equal to the target optical power.

Herein, the energy storage-adjustable charging circuit 110 may use components such as a capacitor and an inductor to store the electric energy.

Specifically, the main control unit 420 may output an $i^{th}$ charging control signal in a one-to-one correspondence with the $i^{th}$ laser in the two-dimensional laser array to the energy storage-adjustable charging circuit 110. In this way, the energy storage value of the energy storage-adjustable charging circuit 110 can be controlled, so that the optical power of the $i^{th}$ laser in the two-dimensional laser array is equal to the target power; and the energy storage-adjustable charging circuit 110 can receive a current output by the emission power supply E under the control of the $i^{th}$ charging control signal output by the main control unit 420, to be charged and to store energy. In an energy transfer phase, the stored electric energy is transferred by the corresponding anode addressing drive circuit 120 to the anode of the laser selected for laser beam emission.

It should be noted that the control module and the main control unit 420 may implement the same or different functions. When the control module and the main control unit 420 respectively implement different functions, the control module and the main control unit 420 may be disposed in the same device or different devices.

The energy storage-adjustable charging circuit 110 and the anode drive circuit 120 are exemplarily described below.

Figure 9:
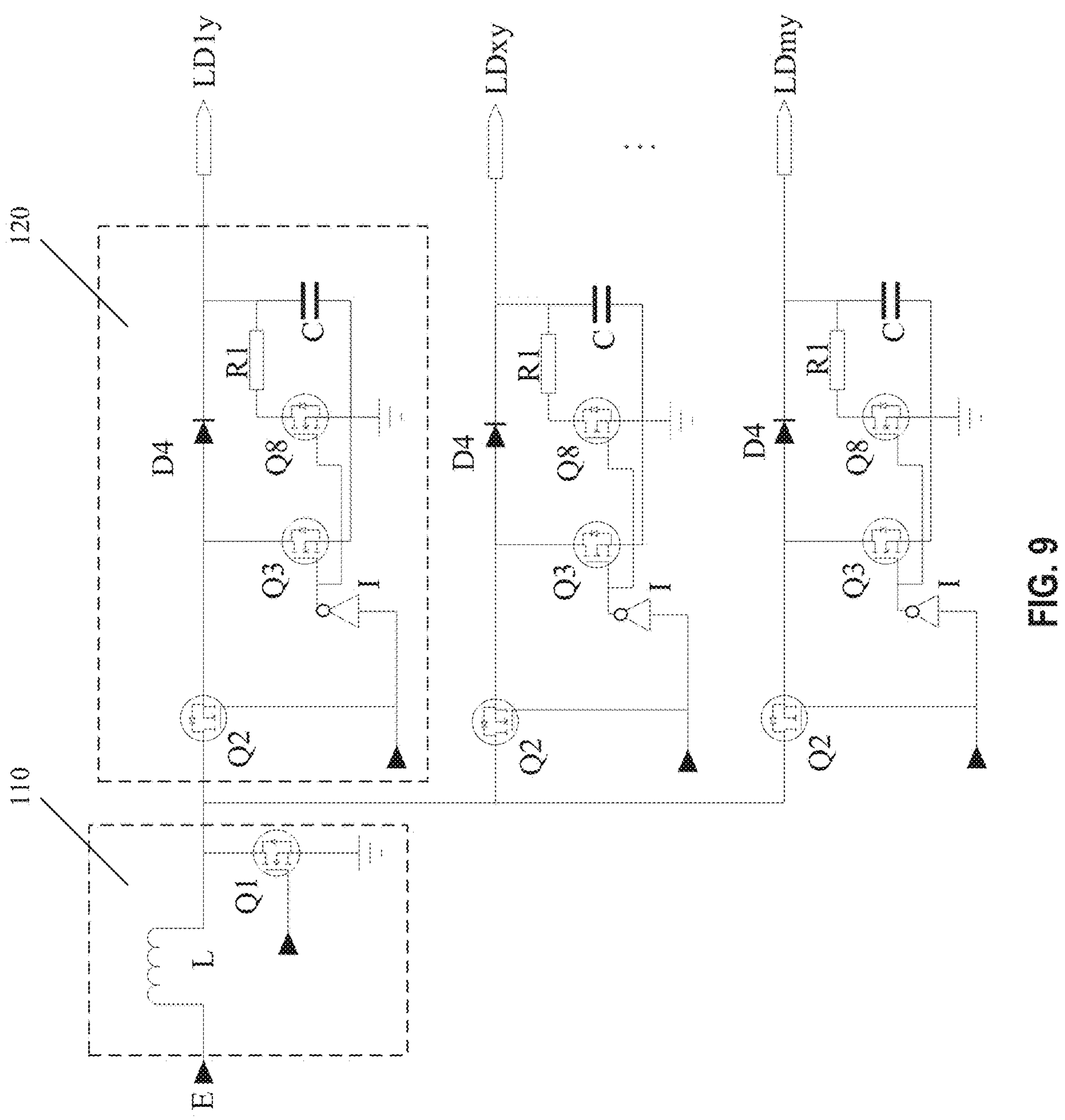
FIG. 9 is a schematic diagram of a circuit structure of an anode addressable drive circuit according to an embodiment of this application.

FIG. 9 is a circuit diagram of an anode addressable drive circuit 100 according to an embodiment of this application. Referring to FIG. 9, the energy storage-adjustable charging circuit 110 includes a charging switch element Q1 and a transitory energy storage element L. The charging switch element Q1 is connected between the emission power supply E and the transitory energy storage element L. When the charging switch element Q1 is turned on, the transitory energy storage element L stores electric energy through the emission power supply E. The charging switch element Q1 may be a MOS transistor, such as an NMOS transistor.

It should be noted that the transitory energy storage element L shown in FIG. 9 is only exemplary, and more transitory energy storage elements such as capacitive elements may also be included. Multiple transitory energy storage elements may be respectively connected to an input end or an output end of the charging switch element Q1 in series. In addition, the multiple transitory energy storage elements L may be respectively connected to the input end and the output end of the charging switch element Q1 in series.

A first end of a transitory energy storage element L in FIG. 9 is connected to the emission power supply E and a second end is connected to a first end of a charging switch element Q1 and ends of the multiple anode addressing drive circuits 120.

The charging switch element Q1 includes a first end, a second end, and a charging enabling end, and receives a charging control signal output by the main control unit 420. The first end is connected to the second end of the transitory energy storage element L, the second end is grounded, and the charging enabling end is connected to the main control unit 420. The charging switch element Q1 is turned on or off under the control of the charging control signal, so that an energy storage value of the transitory energy storage element L is adjustable.

In a specific embodiment, the charging switch element Q1 is an NMOS transistor, a drain of the NMOS transistor serves as the first end of the charging switch element Q1 to be connected to the second end of the transitory energy storage element L. A source of the NMOS transistor serves as a second end of the charging switch element Q1 to be grounded, and a gate of the NMOS transistor is the charging enabling end for receiving the charging control signal. The NMOS transistor is turned on or off under the control of the charging control signal.

In this embodiment, the emission power supply E is connected to the energy storage-adjustable charging circuit 110, to charge the energy storage-adjustable charging circuit 110. A value of the output current of the energy storage-adjustable charging circuit 110 is positively correlated with the energy stored in the transitory energy storage element L in the energy storage-adjustable charging circuit 110. When the optical power of the $i^{t}$ laser needs to be increased, the turn-on time of the charging switch element Q1 can be increased by using the $i^{th}$ charging control signal, to increase the energy stored in the transitory energy storage element L and further increase a laser beam emission current output by the transitory energy storage element L to the laser through the anode addressing drive circuit 120, thereby increasing optical power of the laser selected for laser beam emission.

In this embodiment, the $i^{th}$ charging control signal is used to turn on or off the charging switch element Q1. When the charging switch element Q1 is turned on, the emission power supply E, the transitory energy storage element L, the charging switch element Q1, and the ground form a first charging loop. The transitory energy storage element L stores electric energy through an output current of the emission power supply E, and when the charging switch element Q1 is turned off, the transitory energy storage element L stops storing the electric energy.

Herein, the calibration apparatus 300 configures a mapping relationship between the N lasers in the two-dimensional laser array and the control signals for the main control unit 420 through the control module. The main control unit 420 generates charging control signals in a one-to-one correspondence with the N lasers in the two-dimensional laser array based on the foregoing mapping relationship provided by the calibration apparatus 300, and provides charging control signals in a one-to-one correspondence with the lasers to the energy storage-adjustable charging circuit 110 when the lasers are selected for laser beam emission. Specifically, the main control unit 420 adjusts turn-on duration of the charging switch element Q1 through the $i^{th}$ charging control signal, and further adjusts the energy value of the $i^{th}$ electric energy, so that the $i^{th}$ optical power is equal to the target optical power.

In some embodiments, the $i^{th}$ charging control signal is a pulse signal, and the turn-on duration of the charging switch element Q1 is related to a pulse width of the $i^{th}$ charging control signal. For example, the turn-on duration of the charging switch element Q1 is positively related to the pulse width of the charging control signal. It can be understood that the wider the pulse width, the higher the duty ratio, and the longer the turn-on duration of a specific type of charging switch element Q1.

In some embodiments, the mapping relationship established by the main control unit 420 is a mapping relationship between the $i^{th}$ laser and a pulse width of the $i^{th}$ charging control signal, and the energy storage-adjustable charging circuit 110 obtains the $i^{th}$ charging control signal in a one-to-one correspondence with the $i^{th}$ laser when the $i^{th}$ laser is selected for laser beam emission, so that the $i^{th}$ optical power is equal to the target optical power. For example, the mapping relationship can be expressed in a form of a key-value pair, a table, a mathematical model, or the like. The pulse width can be expressed by duration, and a unit of duration can be microsecond, millisecond, or the like. For example, a specific type of charging control signal can be characterized by a specific preset signal identifier, to determine the $i^{th}$ charging control signal corresponding to a specific pulse width.

In some embodiments, the main control unit 420 may be further configured to generate a pulse parameter configuration table based on the mapping relationship and the pulse width, and the laser beam emission circuit 410 generates the $i^{th}$ control signal in a one-to-one correspondence with the $i^{th}$ laser based on the pulse parameter configuration table, so that the $i^{th}$ optical power is equal to the target optical power.

For example, pulse widths for determining multiple charging control signals are stored in the pulse parameter configuration table. The electronic device can configure the pulse width of the charging control signal based on the parameter configuration table, to output the $i^{th}$ charging control signal in a one-to-one correspondence with the $i^{th}$ laser to the energy storage-adjustable charging circuit 110.

In a specific embodiment, the electronic device may be a device such as a LiDAR that has multiple lasers whose optical power needs to meet a uniformity requirement. In another embodiment, the electronic device may also be another device whose multiple lasers need to emit laser beams uniformly.

In a specific embodiment, the output current of the emission power supply E remains unchanged, and the charging control signal controls adjustability of turn-on time of the charging switch element Q1, so that the energy stored in the transitory energy storage element L is adjustable. When the turn-on time of the charging switch element Q1 is prolonged, the energy stored in the transitory energy storage element L is increased. When the turn-on time of the charging switch element Q1 is shortened, the energy stored in the transitory energy storage element L is decreased.

In this embodiment, the amount of energy stored in the transitory energy storage element L is adjustable, to output a charging current with an adjustable value to the anode addressing drive circuit 120 in the turn-on state, so that a value of the current output by the anode addressing drive circuit 120 to the laser is adjustable, and the luminous power of the laser is adjustable.

Specifically, the transitory energy storage element L is configured to store energy, and also configured to release the stored energy. For example, the transitory energy storage element L includes an energy storage inductor, and the energy storage inductor can convert electrical energy into magnetic energy for storage. For example, the transitory energy storage element L includes an energy storage capacitor, and the energy storage capacitor is formed by sandwiching a layer of insulating dielectric between two metal electrodes. When a voltage is applied between the two metal electrodes, the electrodes store electric charge to store energy.

It should be noted that although the energy storage inductor and the energy storage capacitor store and release energy in different methods, both the energy storage inductor and the energy storage capacitor can be used as elements for storing and releasing energy. A structure and type of the transitory energy storage element L are not specifically limited herein.

Figure 10:
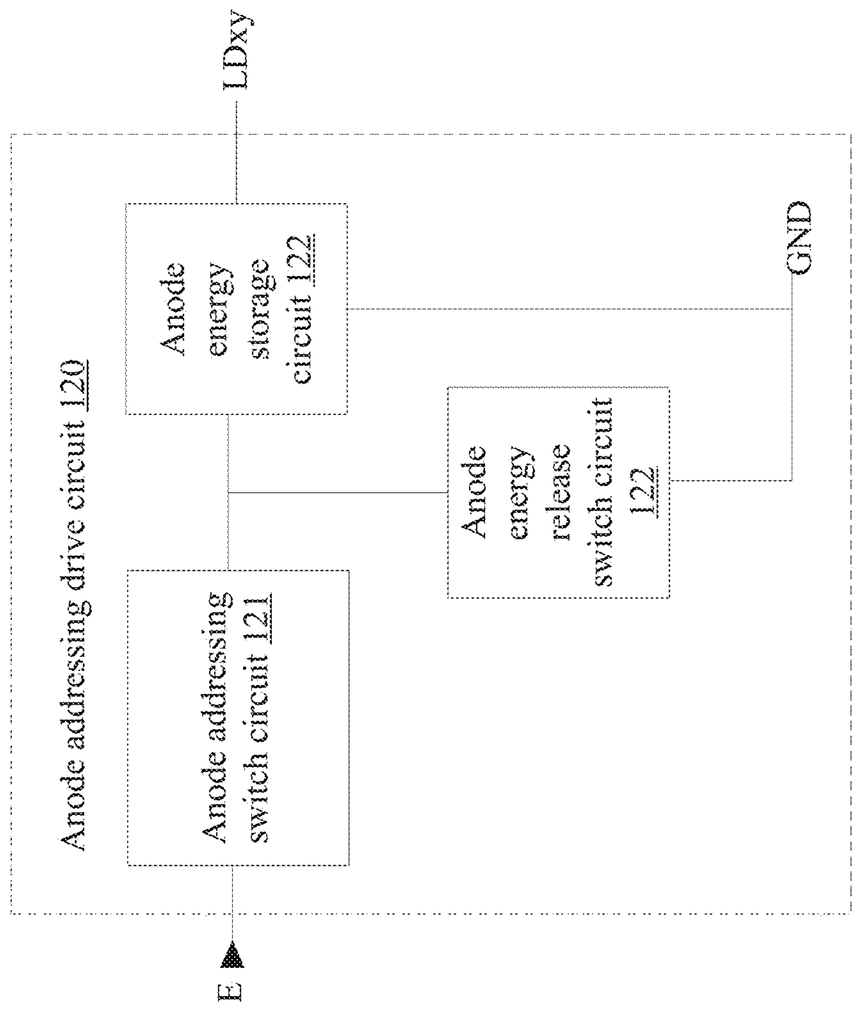
FIG. 10 is a schematic structural diagram of a framework of an anode addressing drive circuit according to an embodiment of this application.

FIG. 10 is a block diagram of an anode addressing drive circuit 120 according to an embodiment of this application.

Referring to FIG. 10, the anode addressing drive circuit 120 includes an anode addressing switch circuit 121 and an anode energy storage circuit 122, the anode addressing switch circuit 121 is connected to a second end of a transitory energy storage element L and the anode energy storage circuit 122, and the anode energy storage circuit 122 is connected to an anode of the laser LDxy connected to a corresponding shared anode end. The anode addressing switch circuit 121 is turned on or off under the control of an anode addressing signal, so that when the second end of the transitory energy storage element L and the anode energy storage circuit 122 are turned on or off and the anode addressing switch circuit 121 is turned on, the anode energy storage circuit 122 is charged through energy stored in the transitory energy storage element L, and the anode energy storage circuit 122 outputs a current to drive the laser LDxy to emit a laser beam.

Figure 11:
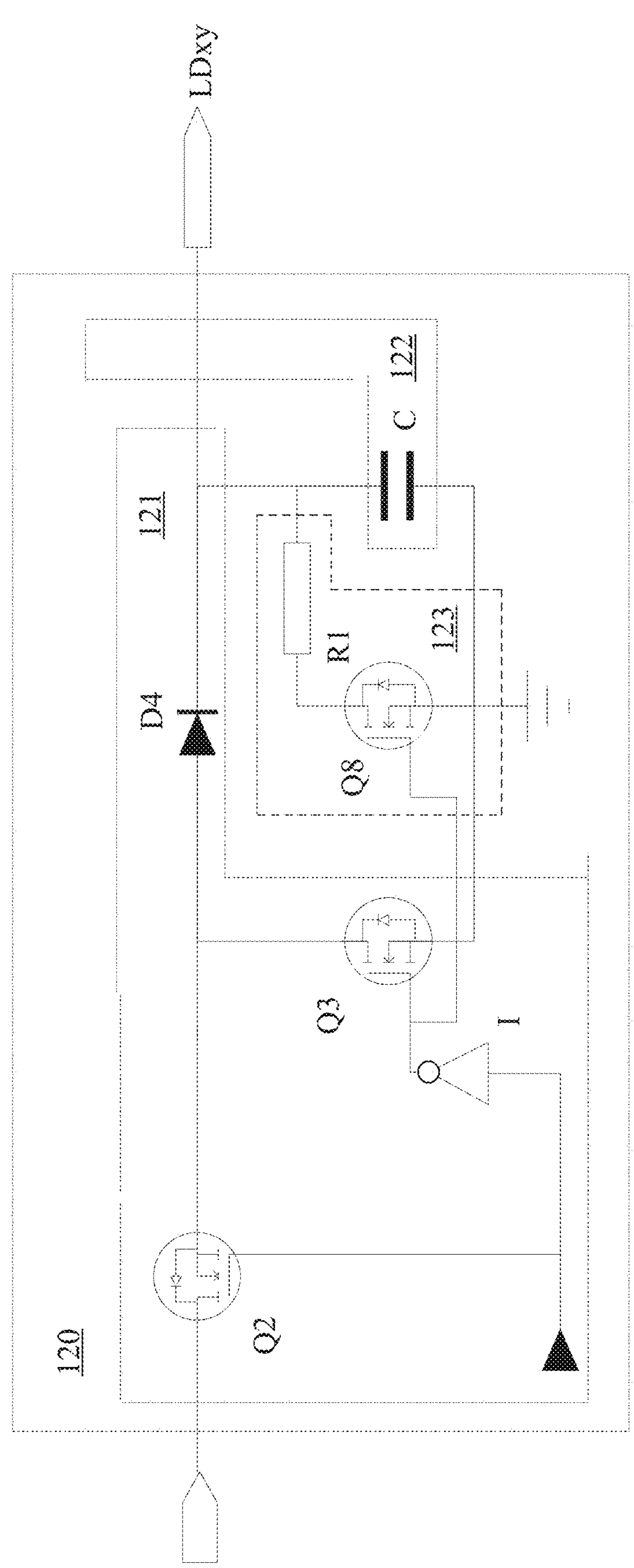
FIG. 11 is a schematic diagram of a circuit structure of an anode addressing drive circuit according to an embodiment of this application.

Referring to FIG. 9 and FIG. 11, in an exemplary solution, the anode addressing switch circuit 121 includes an anode addressing switch element Q2, and the anode addressing switch element Q2 includes a first end, a second end, and an addressing enabling end. The first end of the anode addressing switch element Q2 is connected to a second end of a transitory energy storage element L, the second end is connected to the anode energy storage circuit 122, the addressing enabling end of the anode addressing switch element Q2 receives an anode addressing signal, and the anode addressing signal is used to control the anode addressing switch element Q2 to be turned on or off. When the anode addressing switch element Q2 is turned on, the anode energy storage circuit 122 is charged through an output current of the transitory energy storage element L, and the anode energy storage circuit 122 outputs the current to drive the laser LDxy to emit a laser beam.

In an embodiment, the anode addressing switch element Q2 is a second NMOS transistor, a drain of the second NMOS transistor serves as the first end of the anode addressing switch element Q2 to be connected to the transitory energy storage element L, a source of the second NMOS transistor serves as the second end of the anode addressing switch element Q2 to be connected to the anode energy storage circuit 122, and a gate of the second NMOS transistor serves as the anode addressing enabling end to receive the anode addressing signal HS. The second NMOS transistor is turned on or off under the control of the anode addressing signal. The second aspect is intended to solve a problem of laser beam leakage and false laser beam emission of the laser caused by a parallel parasitic capacitor when the anode addressing switch circuit includes the parallel parasitic capacitor. Referring to FIG. 11 and FIG. 12T, the anode energy storage circuit 122 provided in this application includes an anode energy storage element C, a first end of the anode energy storage element C is connected to a second end of the anode addressing switch element Q2 and the anode of the laser LDxy, and a second end is grounded. When the anode addressing switch element Q2 is turned on, the transitory energy storage element L, the anode addressing switch element Q2, the anode energy storage element C, and the ground form a second charging loop, and the anode energy storage element C stores electric energy through the output current of the energy storage-adjustable charging circuit 110, and releases the electric energy stored to output a current to drive the laser LDxy to emit a laser beam.

In an embodiment, the anode energy storage element C is charged through the second charging loop, the energy stored in the transitory energy storage element L is transmitted to the anode energy storage element C, and therefore, the amount of transmitted energy depends on the transitory energy storage element L. It can be learned from the foregoing description that the energy stored in the transitory energy storage element L can be controlled by controlling the turn-on time of the charging switch element Q1, and then the energy stored in the anode energy storage element C can be further controlled.

In an example, the anode energy storage element C includes an energy storage capacitor.

In an example, when the anode addressing switch element is turned on, the emission power supply E directly outputs a current to drive the laser LDxy to emit a laser beam. Because the current directly output by the emission power supply E is large, a current of a branch to which the parasitic capacitor connected to the anode addressing switch element K1 in parallel belongs may be greater than a current threshold for allowing the laser LDxy to emit a laser beam, thereby causing laser beam leakage and false laser beam emission of the laser LDxy.

The anode addressing drive circuit 120 provided in this embodiment of this application stores electric energy through the anode energy storage circuit 122, and the anode energy storage circuit 122 releases the electric energy stored in the anode energy storage circuit to output the current to drive the laser LDxy to emit a laser beam, so that a current flowing through the parallel parasitic capacitor to the laser LDxy is less than a laser beam emission current threshold of the laser when the energy storage-adjustable charging circuit 110 outputs a current to charge the anode energy storage circuit 122 by using stored electric energy, thereby avoiding laser beam leakage and false laser beam emission of the laser caused by the parallel parasitic capacitor when the emission power supply E directly outputs a current to drive the laser LDxy to emit a laser beam.

Further, the energy stored in the anode energy storage circuit 122 originates from the energy stored in the transitory energy storage element L, the transitory energy storage element L is preferably an energy storage inductor. On the one hand, a charging speed of the energy storage inductor is less than that of the capacitor, and therefore, the energy stored in the transitory energy storage element L can be better controlled by controlling the turn-on time of the charging switch element Q1. On the other hand, a discharge current of the energy storage inductor is small, to ensure that a current flowing through the parallel parasitic capacitor to the laser LDxy is less than a laser beam emission current threshold of the laser LDxy when the anode energy storage circuit 122 is charged, thereby avoiding laser beam leakage and false laser beam emission of the laser LDxy caused by the parallel parasitic capacitor when the emission power supply E charges the anode energy storage circuit 122.

This embodiment is intended to solve problems that isolation of the anode addressing switch circuit 121 is reduced and crosstalk of electrical signals of a laser unselected for laser beam emission and a laser selected for laser beam emission occurs during laser beam emission when the anode addressing switch element Q2 includes parallel parasitic capacitors.

The anode addressing switch circuit 121 provided in this embodiment of this application further includes a unidirectional conducting element and a reverse-biased switch element Q3, the unidirectional conducting element is connected between an anode addressing switch element Q2 and an anode energy storage element C, the second end of the unidirectional conducting element is connected to the second end of the anode addressing switch element Q2, and a first end is connected to a first end of an anode energy storage element C. The reverse-biased switch element Q3 includes a first end, a second end, and a reverse-biased enabling end. The first end of the reverse-biased switch element Q3 is connected to the second end of the unidirectional conducting element, the second end is grounded, and the reverse-biased enabling end receives a reverse-biased control signal. The reverse-biased control signal and the anode addressing signal are in reverse states. When the anode addressing signal is at a high level, the reverse-biased control signal is at a low level; or when the anode addressing signal is at a low level, the reverse-biased control signal is at a high level. The reverse-biased control signal is used to turn off the reverse-biased switch element Q3 when the anode addressing switch element Q2 is turned on through the anode addressing signal, and the anode addressing switch element Q2 connects an anode of the unidirectional conducting element to a second end of a transitory energy storage element L, so that the unidirectional conducting element is in the forward turn-on state. The transitory energy storage element L, the addressing switch element Q2, the unidirectional conducting element, the anode energy storage element C, and the ground form a second charging loop. The reverse-biased control signal is also used to turn on the reverse-biased switch element Q3 when the anode addressing switch element Q2 is turned off through the anode addressing signal, and the first end of the unidirectional conducting element is grounded through the reverse-biased switch element Q3, so that the unidirectional conducting element is in a reverse-biased state and the current is prevented from flowing through the anode addressing switch element Q2, thereby improving the isolation of the anode addressing switch circuit 121.

In an embodiment, when the laser LDxy is selected for laser beam emission, at a charging stage of the anode energy storage element C, the anode addressing switch element Q2 is turned on under the enablement of the anode addressing signal, and the unidirectional conducting element is in the forward turn-on state. The transitory energy storage element L, the anode addressing switch element Q2, the unidirectional conducting element, the anode energy storage element C, and the ground form a second charging loop, a current output by the transitory energy storage element L flows through the unidirectional conducting element to the anode energy storage element C, to charge the anode energy storage element C, and the anode energy storage element C outputs a current through energy stored in the anode energy storage element C, to drive the laser LDxy to emit a laser beam. When the laser LDxy is not selected for laser beam emission, the anode addressing switch element Q2 is turned off under the control of the anode addressing signal, and the reverse-biased switch element Q3 is turned on under the enablement of the reverse-biased control signal, so that the unidirectional conducting element is in the reverse-biased state, to prevent the current from flowing through the anode addressing switch element Q2, and ensure that the laser LDxy that is not selected for laser beam emission does not experience crosstalk caused by an electrical signal of another laser selected for laser beam emission.

In an exemplary solution, referring to FIG. 9 and FIG. 11, the unidirectional conducting element is a fourth diode D4, the reverse-biased switch element Q3 is a third NMOS transistor, an anode of the fourth diode D4 is connected to a source of the second NMOS transistor and a drain of the third NMOS transistor, a cathode is connected to the first end of the anode energy storage element C, a source of the third NMOS transistor is grounded, and a gate of the third NMOS transistor receives a reverse-biased control signal. When the laser LDxy is selected for laser beam emission, at a charging stage of the anode energy storage element C, the anode addressing switch element Q2 is turned on under the enablement of the anode addressing signal, an output current of the transitory energy storage element L flows through the anode of the fourth diode D4 to the cathode of the fourth diode D4, and the fourth diode D4 is in the forward turn-on state. When the laser LDxy is unselected for laser beam emission, the anode addressing switch element Q2 is turned off under the control of the anode addressing signal, the reverse-biased switch element Q3 is turned on under the enablement of the reverse-biased control signal, the anode of the fourth diode D4 is grounded through the reverse-biased switch element Q3, and the fourth diode D4 is in the reverse-biased state.

Further, when the anode addressing switch element Q2 is turned on under the enablement of the anode addressing signal, the anode addressing signal is at a high level greater than a ground voltage, or when the anode addressing switch element Q2 is turned off through the anode addressing signal, the anode addressing signal is at a low level lower than or equal to the ground voltage.

In another exemplary solution, the unidirectional conducting element is a fourth NMOS transistor, the reverse-biased switch element Q3 is a third NMOS transistor, a source of the fourth NMOS transistor is connected to a source of the second NMOS transistor and a drain of the third NMOS transistor, a drain is connected to the first end of the anode energy storage element C, and a gate is connected to the addressing enabling end of the anode addressing switch element Q2. When the laser LDxy is selected for laser beam emission, at a charging stage of the anode energy storage element, the anode addressing switch element Q2 and the fourth NMOS transistor are turned on under the enablement of the anode addressing signal, an output current of the transitory energy storage element L flows through the source of the fourth NMOS transistor to the drain of the fourth NMOS transistor, and the fourth NMOS transistor is in the forward turn-on state. When the laser LDxy is unselected for laser beam emission, the anode addressing switch element Q2 and the fourth NMOS transistor are turned off under the control of the anode addressing signal, the reverse-biased switch element Q3 is turned on under the enablement of the reverse-biased control signal, the source of the fourth NMOS transistor is grounded through the reverse-biased switch element Q3, and the fourth NMOS transistor is in the reverse-biased state.

Further, when the anode addressing switch element Q2 and the fourth NMOS transistor are turned on under the enablement of the anode addressing signal, the anode addressing signal is at a high level greater than the ground voltage; or when the anode addressing switch element Q2 and the fourth NMOS transistor are turned off through the anode addressing signal, the anode addressing signal is at a low level lower than or equal to the ground voltage.

In this embodiment, when the laser LDxy finishes emitting a laser beam, there is still residual energy in the anode energy storage element C. and the residual energy in the anode energy storage element C may damage another element, and also affect subsequent energy storage of the anode energy storage element C.

This embodiment is intended to solve the problem that subsequent energy storage of the anode energy storage element C is affected because another element is damaged by residual energy existing in the anode energy storage element C in the anode addressing drive circuit 120. The anode addressing drive circuit 120 provided in this embodiment of this application further includes an anode energy release switch circuit 123, the anode energy release switch circuit 123 includes an energy release switch element Q8, the energy release switch element Q8 includes a first end, a second end, and an energy release enabling end. The first end of the energy release switch element Q8 is connected to the first end of the anode energy storage element C, the second end is grounded, and the energy release enabling end receives an energy release control signal. The energy release control signal and the anode addressing signal are in reverse states. Specifically, when the anode addressing signal is at a high level, the energy release control signal is at a low level; or when the anode addressing signal is at a low level, the energy release control signal is at a high level. The energy release control signal is used to turn off the energy release switch element Q8 when the anode addressing switch element Q2 is turned on through the anode addressing signal, and the anode addressing switch element Q2 connects a second end of the unidirectional conducting element to a second end of a transitory energy storage element L, so that the unidirectional conducting element is in the forward turn-on state. The transitory energy storage element L, the anode addressing switch element Q2, the unidirectional conducting element, the anode energy storage element C, and the ground form a second charging loop. The energy release control signal is also used to turn on the energy release switch element Q8 when the anode addressing switch element Q2 is turned off through the anode addressing signal, and the second end of the anode energy storage element C is grounded through the energy release switch element Q8, the anode energy storage element C, the energy release switch element Q8, and the ground form an energy release loop, to release residual energy from the anode energy storage element C.

In an exemplary solution, the energy release switch element Q8 is an eighth NMOS transistor, a drain of the fourth NMOS transistor serves as the first end of the energy release switch element Q8 to be connected to the first end of the anode energy storage element C, a source of the fourth NMOS transistor serves as the second end of the energy release switch element Q8 to be grounded, and a gate serves as the energy release enabling end of the energy release switch element Q8 to receive an energy release control signal. When the laser LDxy is selected for laser beam emission, at a charging stage of the anode energy storage element C, the anode addressing switch element Q2 is turned on under the enablement of the anode addressing signal, and an output current of the transitory energy storage element L flows through the unidirectional conducting element to the energy storage element C. When the laser Ldxy is unselected for laser beam emission, the anode addressing switch element Q2 is turned off under the control of the anode addressing signal, the energy release switch element Q8 is turned on under the enablement of the energy release control signal, and the first end of the anode energy storage element C is grounded through the energy release switch element Q8, to release residual energy from the anode energy storage element C.

Further, when the residual energy in the anode energy storage element is released through the energy release circuit, a large release current may affect the energy release switch element Q8, that is, the large release current may damage the energy release switch element Q8. To solve the problem, the anode energy release circuit provided in this embodiment of this application also includes a first current limiting element R1 to limit a current for releasing energy from the anode energy storage element, thereby reducing a possibility of damage to the energy release switch element Q8 when the energy is released from the anode energy storage element C.

Specifically, the first end of the first current limiting element R1 is connected to the first end of the energy release switch element Q8, and the second end is connected to the first end of the anode energy storage element C. When the energy release switch element Q8 is turned on under the enablement of the energy release control signal, the anode energy storage element C, the first current limiting element R1, the energy release switch element Q8, and ground form an energy release loop.

It can be understood that the greater the resistance of the first current limiting element R1, the stronger the current limiting capability of the first current limiting element R1 during current release of the anode energy storage element C, and the greater the voltage drop across two ends of the first current limiting element R1.

Further, in an embodiment of this application, to easily control the anode addressing switch element Q2, the reverse-biased switch element Q3, and the energy release switch element Q8, the anode addressing drive circuit 120 further includes a phase inverter I, the first end of the phase inverter I is connected to the addressing enabling end, and the second end of the phase inverter I is connected to the reverse-biased enabling end and the energy release enabling end. Specifically, an input end of the phase inverter I is connected to the addressing enabling end of the anode addressing switch element Q2, and the output end is connected to the reverse-biased enabling end of the reverse-biased switch element Q3 and the energy release enabling end of the energy release switch element Q8, and therefore, the state of the reverse-biased switch element Q3 is the same as that of the energy release switch element Q8 and different from that of the anode addressing switch element Q2.

In some other embodiments, the anode addressing drive circuit includes a reverse-biased phase inverter and an energy release phase inverter, an input end of the reverse-biased phase inverter is connected to the addressing enabling end of the anode addressing switch element Q2, the output end is connected to the reverse-biased enabling end of the reverse-biased switch element Q3, an input end of the energy release phase inverter is connected to the addressing enabling end of the anode addressing switch element Q2, an output end is connected to the energy release enabling end of the energy release switch element Q8, and therefore, the state of the reverse-biased switch element Q3 is the same as that of the energy release switch element Q8 and different from that of the anode addressing switch element Q2.

In some other embodiments, an input end of the phase inverter I may be connected to the reverse-biased enabling end of the reverse-biased switch element Q3 and the energy release enabling end of the energy release switch element Q8, and the output end is connected to the addressing enabling end of the anode addressing switch element Q2, and in this case, the reverse-biased switch element Q3 may be in a turn-on state that is the same as that of the energy release switch element Q8 and different from that of the anode addressing switch element.

In this embodiment, the laser beam emission circuit concentrates the anode addressable drive circuit and the cathode addressable drive circuit on one side of the two-dimensional laser array, to increase reliability of the two-dimensional laser array (for example, the resolution is m×n), for example, voltage tolerance, current flowing performance, and electrostatic protection performance.

In addition, the anode addressable drive circuit is connected to the anode of the laser in the same row through the shared anode end and connected to the cathode of the laser in the same column through the shared cathode end, so that the number of channels of the two-dimensional laser array can be reduced and a manufacturing cost of the laser beam emission circuit is further reduced.

In an embodiment, a process of driving addressing of the laser array by the addressable drive circuit in the laser array is as follows.

In the first stage, the charging control signal controls the charging switch element Q1 to be turned on. The anode addressing signal controls the anode switch circuit 110 to be turned off, and in an example, the anode switch circuit 110 is in a reverse-biased state. The cathode addressing signal controls the cathode switch circuit to be turned off.

The transitory energy storage element L stores electric energy through the output current of the emission power supply E. The turn-on time of the charging switch element Q1 is controlled by using a charging control signal based on actually required luminous power of the laser, to adjust the amount of electric energy stored in the transitory energy storage element L.

In the second stage, the charging switch element Q1 in the energy storage-adjustable charging circuit 110 is turned off, the transitory energy storage element L stops storing energy. The anode addressing switch element Q2 in a row to which the laser selected for laser beam emission belongs is turned on under the control of the anode addressing signal, and more specifically, the anode switch circuit 110 is in the forward turn-on state. The cathode addressing switch in a column to which the laser selected for laser beam emission belongs is turned off under the control of the cathode addressing signal.

The unidirectional conducting element is in the forward turn-on state, and the transitory energy storage element L outputs a current to charge the capacitive element C.

In the third stage, the cathode addressing switch element in the column to which the laser selected for laser beam emission belongs is turned on under the control of the cathode addressing signal.

The capacitive element C outputs a current to drive the laser selected for laser beam emission to emit a laser beam.

When the current laser selected for laser beam emission finishes emitting laser beams, the corresponding anode addressing switch element Q2 in the row to which the laser belongs is turned off under the control of the anode addressing signal, the corresponding reverse-biased switch element Q3 in the row to which the laser belongs is turned on under the control of the reverse-biased control signal, and the corresponding energy release switch element Q8 in the row to which the laser belongs is turned on under the control of the energy release control signal.

The unidirectional conducting element is in the reverse-biased state, and the transitory energy storage element L stops outputting a current to charge the capacitive element C. The anode energy release switch circuit 123 releases the residual energy from the capacitive element C.

Further, when the multiple rows of anode addressing drive circuits corresponding to the multiple lasers are turned on under the enablement of the anode addressing signal and the multiple columns of cathode addressing drive circuits corresponding to the multiple lasers are turned on under the enablement of the cathode addressing signal, the multiple lasers can emit laser beams simultaneously.

In addition, the anode addressing signal can also simultaneously drive anode addressing switch elements Q2 corresponding to two or more shared anode ends to be turned on, the cathode addressing signal can also simultaneously drive cathode addressing switch elements corresponding to two or more shared cathode ends to be turned on, so that two or more lasers can emit laser beams simultaneously. The specific number of lasers that emit laser beams simultaneously can be set by scanning the anode addressing signal and the cathode addressing signal based on an actual need.

In another exemplary solution, the anode addressing switch element Q2 is a second PMOS transistor, a drain of the second PMOS transistor serves as the first end of the anode addressing switch element Q2 to be connected to the transitory energy storage element L, a source of the second PMOS transistor serves as the second end of the anode addressing switch element Q2 to be connected to the anode energy storage circuit 122, and a gate of the second PMOS transistor serves as the addressing enabling end of the anode addressing switch element Q2 to receive the anode addressing signal. The second PMOS transistor is turned on or off under the control of the anode addressing signal.

A voltage condition VGS when the anode addressing signal drives the second PMOS transistor to be turned on is opposite to a voltage condition VGS when the anode addressing signal drives the second NMOS transistor to be turned on, where VGS=VG−VS, VG is a gate voltage of the MOS transistor (the second NMOS transistor or the second PMOS transistor), and VS is a source voltage of the MOS transistor (the second NMOS transistor or the second PMOS transistor). For example, a condition for turning on the second NMOS transistor is that VGS of the second NMOS transistor is greater than or equal to Vth. In this case, the anode addressing signal is at a high level when the second NMOS transistor is turned on, and the anode addressing signal is at a low level when the second NMOS transistor is turned off. A condition for turning on the second PMOS transistor is that VGS of the second PMOS transistor is less than or equal to Vth. In this case, the anode addressing signal is at a low level when the second PMOS transistor is turned on, and the anode addressing signal is at a high level when the second PMOS transistor is turned off.

In an exemplary solution, the anode reverse-biased switch element Q3 is a third NMOS transistor, the anode unidirectional conducting element is a fourth NMOS transistor, a drain of the second PMOS transistor serves as the first end of the anode addressing switch element Q2 to be connected to the transitory energy storage element L, a source of the second PMOS transistor serves as the second end of the anode addressing switch element Q2 to be connected to the source of the fourth NMOS transistor and a drain of the third NMOS transistor, a gate of the second PMOS transistor is connected to a gate of the fourth NMOS transistor through the second anode phase inverter, a source of the third NMOS transistor is grounded, and a gate of the third NMOS transistor is connected to a gate of the second NMOS transistor. When the laser LDxy is selected for laser beam emission, at a charging stage of the anode energy storage element C, the second PMOS transistor is turned on under the enablement of the anode addressing signal, the fourth NMOS transistor is turned on under the control of the anode addressing signal, the third NMOS transistor is turned off under the control of the anode reverse-biased control signal, the source of the fourth NMOS transistor is connected to the transitory energy storage element L through the second PMOS transistor, and the fourth NMOS transistor is in the forward turn-on state. When the laser LDxy is stopped from emitting a laser beam, the second PMOS transistor is turned off under the control of the anode addressing signal, the third NMOS transistor is turned on under the enablement of the anode reverse-biased control signal, the source of the fourth NMOS transistor is grounded through the third NMOS transistor, and the fourth NMOS transistor is in the reverse-biased state.

In this case, when the second PMOS transistor is turned on under the enablement of the anode addressing signal, the anode addressing signal is at a low level lower than an anode drive level; or when the second PMOS transistor is turned off under the control of the anode addressing signal, the anode addressing signal is at a high level higher than the anode drive level.

In an example, the anode addressing switch circuit 121 further includes a second anode phase inverter, an input end of the second anode phase inverter is connected to a gate of the second PMOS transistor, and the output end is connected to the gate of the fourth NMOS transistor, so that the fourth NMOS transistor and the second PMOS transistor are in the same state.

In some other embodiments, the input end of the second anode phase inverter may be connected to a gate of the fourth NMOS transistor, the output end is connected to the gate of the second PMOS transistor, and therefore, the fourth NMOS transistor and the second PMOS transistor are in the same state.

When the anode addressing signal and the anode reverse-biased control signal are both at the low level, the second PMOS transistor is turned on under the control of the anode addressing signal, the fourth NMOS transistor is turned on under the control of a phase-inverted anode addressing signal (high level), the third NMOS transistor is turned off under the control of the anode reverse-biased control signal, and the source of the fourth NMOS transistor is connected to the transitory energy storage element L through the second PMOS transistor, so that the fourth NMOS transistor is in the forward turn-on state. When the anode addressing signal and the anode reverse-biased control signal are both at the high level, the second PMOS transistor is turned off under the control of the anode addressing signal, the third NMOS transistor is turned on under the control of the anode reverse-biased control signal, and the third NMOS transistor enables the source of the fourth NMOS transistor to be grounded, so that the fourth NMOS transistor is in the reverse-biased state.

In another exemplary solution in this embodiment, the anode reverse-biased switch element Q3 is a third NMOS transistor, the anode unidirectional conducting element is a fourth diode D4, a drain of the second PMOS transistor serves as the first end of the anode addressing switch element Q2 to be connected to the transitory energy storage element L, a source of the second PMOS transistor serves as the second end of the anode addressing switch element Q2 to be connected to the anode of the fourth diode D4 and a drain of the third NMOS transistor, and a gate of the second PMOS transistor receives the anode addressing signal, a source of the third NMOS transistor is grounded, a gate of the third NMOS transistor is connected to a gate of the second PMOS transistor. When the laser LDxy is selected for laser beam emission, at a charging stage of the anode energy storage element C, the second PMOS transistor is turned on under the enablement of the anode addressing signal, the third NMOS transistor is turned off under the control of the anode reverse-biased control signal, the anode of the fourth diode D4 is connected to the transitory energy storage element L through the second PMOS transistor, and the fourth diode D4 is in the forward turn-on state. When the laser LDxy is stopped from emitting a laser beam, the second PMOS transistor is turned off under the control of the anode addressing signal, the third NMOS transistor is turned on under the enablement of the anode reverse-biased control signal, the anode of the fourth diode D4 is grounded through the third NMOS transistor, and the fourth diode D4 is in the reverse-biased state.

In this case, when the second PMOS transistor is turned on under the enablement of the anode addressing signal, the anode addressing signal is at a low level lower than or equal to an anode drive level; or when the second PMOS transistor is turned off under the control of the anode addressing signal, the anode addressing signal is at a high level higher than the anode drive level.

When the anode addressing signal and the anode reverse-biased control signal are both at the low level, the second PMOS transistor is turned on under the control of the anode addressing signal, the third NMOS transistor is turned off under the control of the anode reverse-biased control signal, and an anode of the fourth diode D4 is connected to the transitory energy storage element L through the second PMOS transistor, so that the fourth diode D4 is in the forward turn-on state. When the anode addressing signal and the anode reverse-biased control signal are both at the high level, the second PMOS transistor is turned off under the control of the anode addressing signal, the third NMOS transistor is turned on under the control of the anode reverse-biased control signal, and the third NMOS transistor enables the anode of the fourth diode D4 to be grounded, so that the fourth diode D4 is in the reverse-biased state.

In the anode addressing switch circuit 121 provided in this embodiment of this application, when the anode addressing switch element Q2 is turned off, the anode unidirectional conducting element is in a reverse-biased state, a current is prevented from flowing through the anode addressing switch element Q2, thereby improving isolation of the anode addressing switch circuit 121 and avoiding crosstalk of electrical signals of a laser LDxy stopped from emitting a laser beam and another laser selected for laser beam emission.

Figure 12:
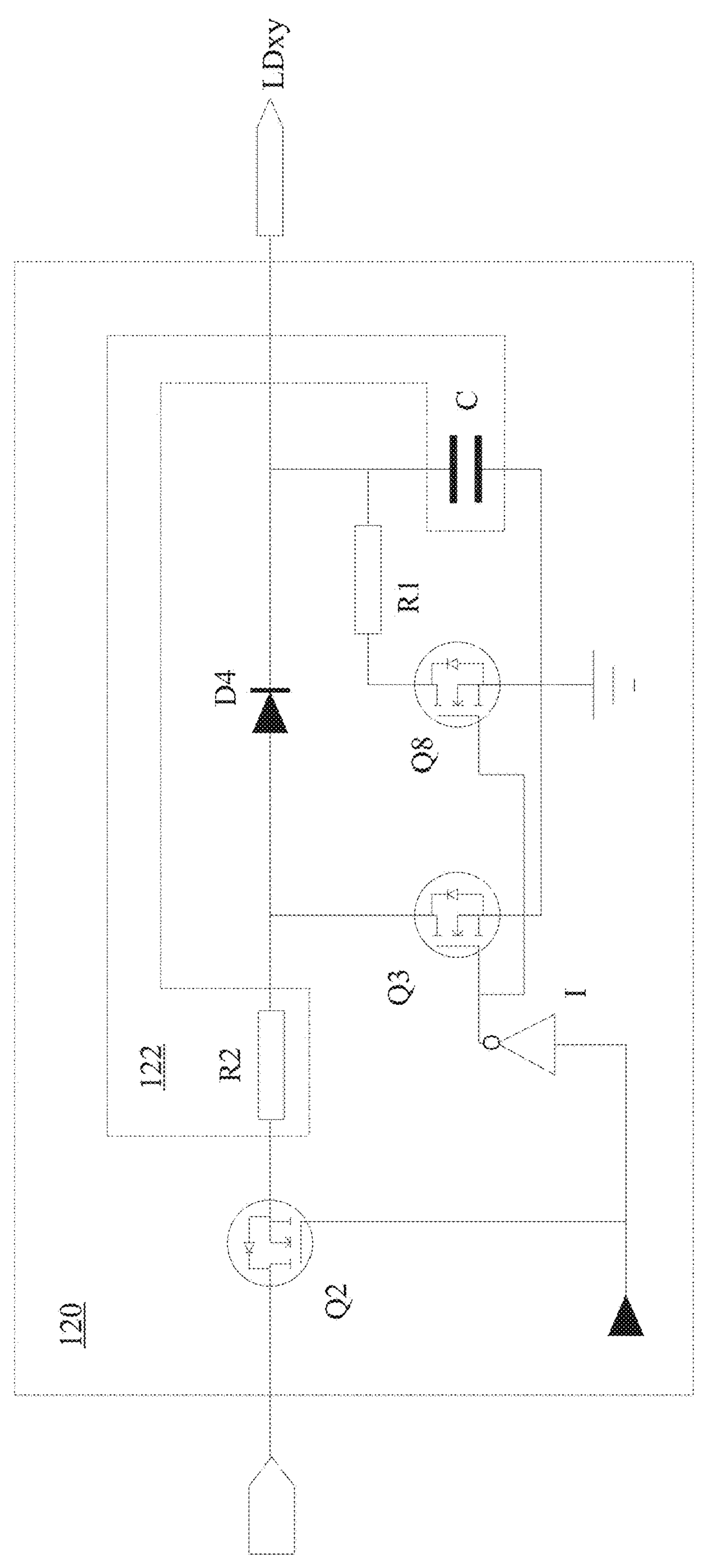
FIG. 12 is a schematic diagram of another circuit structure of an anode addressing drive circuit according to an embodiment of this application.

FIG. 12 is a circuit diagram of another anode addressing drive circuit according to an embodiment of this application.

As shown in FIG. 12, the anode energy storage circuit 122 also includes a second current limiting element R2, a first end of the second current limiting element R2 is connected to the second end of the anode addressing switch element Q2, the second end is connected to the first end of the anode energy storage element C and the anode of the laser LDxy, and the second current limiting element R2 is configured to limit a current output by the transitory energy storage element L to charge the anode energy storage element C, so that the charging current is less than the current threshold for allowing the laser LDxy to emit a laser beam, thereby avoiding laser beam leakage and false laser beam emission of the laser LDxy caused by the parallel parasitic capacitor when the emission power supply E charges the anode energy storage circuit.

The cathode addressing switch element in the cathode addressing switch circuit includes a parallel parasitic capacitor. Therefore, when the transitory energy storage element charges the anode energy storage element C through two loops. In the first loop, the transitory energy storage element L, the anode addressing switch element Q2, the unidirectional conducting element, the anode energy storage element, and the ground jointly form a second charging loop. In the second loop, the transitory energy storage element L, the anode addressing switch element Q2, the unidirectional conducting element, the laser LD, the parasitic capacitor of the cathode addressing switch element, and the ground jointly form a charging loop.

In this case, the laser is connected to the parasitic capacitor of the cathode addressing switch element in series, and therefore, the charging current of the parasitic capacitor of the cathode addressing switch element is equal to the current flowing through the laser. Once the charging current flowing through the parasitic capacitor of the cathode addressing switch element is greater than the laser beam emission current threshold of the laser, the laser is excited to emit a laser beam incorrectly when the transitory energy storage element L charges the anode energy storage element (in this case, the cathode addressing switch element is not turned on, and theoretically does not emit a laser beam). In this embodiment provided in this application, the second current limiting element R2 is disposed in the anode energy storage circuit to limit the charging current of the parasitic capacitor of the cathode addressing switch element when the anode addressing drive circuit 120 is turned on, so that the charging current of the parasitic capacitor of the cathode addressing switch element is less than the laser beam emission current threshold of the laser, and the laser does not emit a laser beam incorrectly in the charging stage of the anode energy storage element.

It can be understood that the greater the resistance of the second current limiting element R2, the stronger the current limiting capability of the second current limiting element R2 for the anode energy storage element C, and the greater the voltage drop across two ends of the second current limiting element R2.

Figure 13:
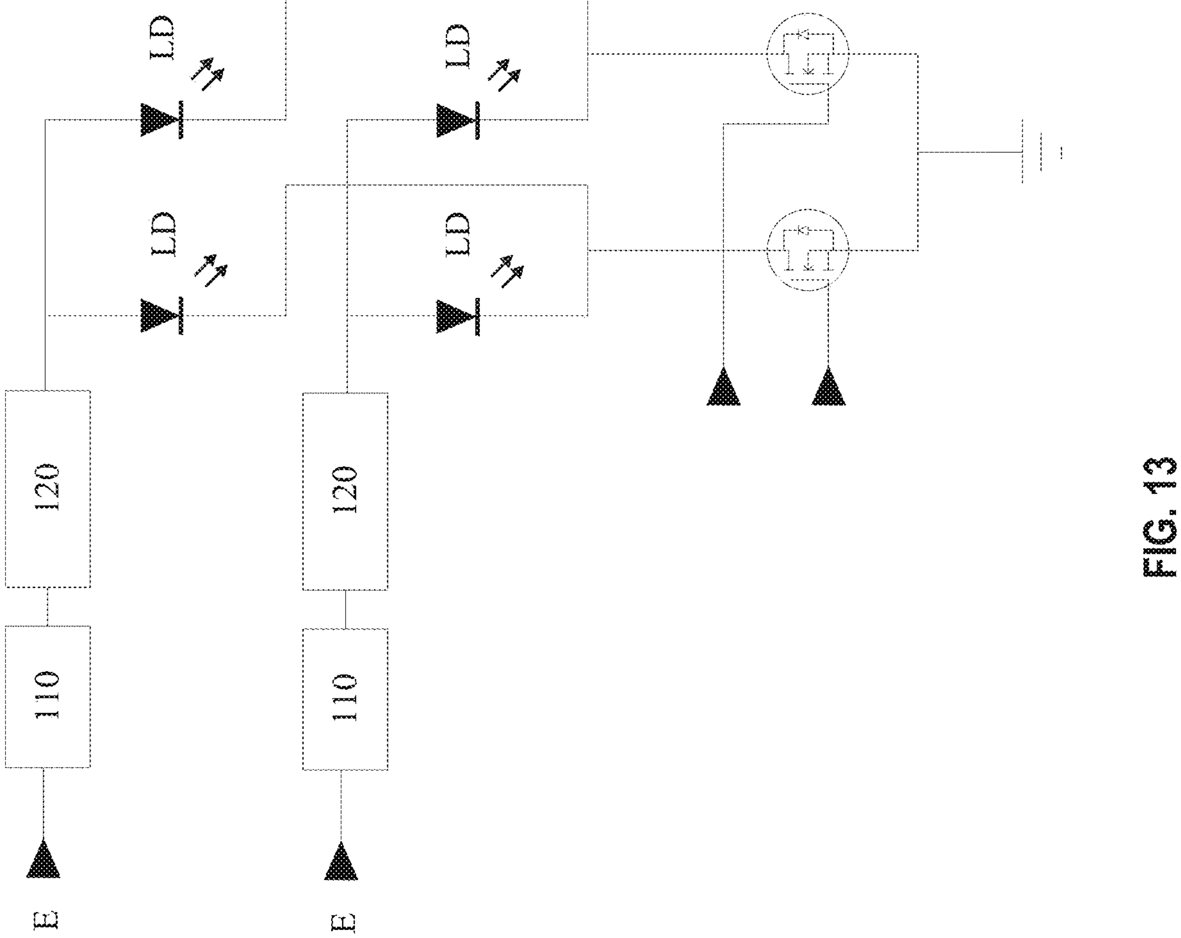
FIG. 13 is a schematic structural diagram of another framework of an anode addressable drive circuit according to an embodiment of this application.

FIG. 13 is a circuit diagram of another anode addressable drive circuit 100 according to an embodiment of this application.

As shown in FIG. 13, there are multiple energy storage-adjustable charging circuits 110, and each energy storage-adjustable charging circuit 110 is one-to-one connected to one anode addressing drive circuit. In this case, the main control unit 420 respectively outputs charging control signals one-to-one to energy storage-adjustable charging circuit 110, and under the control of charging control signals in the one-to-one correspondence, the multiple energy storage-adjustable charging circuits 110 adjust stored electric energy, so that the optical power of the selected laser is equal to the target optical power.

In this embodiment, the cathode addressing drive circuit 220 includes a cathode addressing switch circuit, one end of the cathode addressing switch circuit is connected to a cathode of a laser, and the other end is grounded. Specifically, the cathode addressing switch circuit includes a cathode addressing switch element, and the cathode addressing switch element includes a first end, a second end, and an addressing enabling end. The first end of the cathode addressing switch element is connected to the cathode of the laser, the second end is grounded, the addressing enabling end receives a cathode addressing signal, and the cathode addressing switch element is turned on or off under the control of the cathode addressing signal.

In this embodiment, the cathode addressing switch element is an NMOS transistor, a drain of the NMOS transistor serves as the first end of the cathode addressing switch element to be connected to the cathode of the laser, a source serves as the second end of the cathode addressing switch element to be grounded, and a gate serves as the addressing enabling end of the cathode addressing switch element to receive a cathode addressing signal.

In some embodiments, to easily adjust the electric energy stored in the energy storage-adjustable charging circuit 110 by using a digital signal, the $i^{th}$ charging control signal is a pulse signal, and the turn-on duration of the charging switch element Q1 is related to a pulse width of the $i^{th}$ charging control signal.

Correspondingly, the mapping relationship established by the main control unit 420 is a mapping relationship between the $i^{th}$ laser and the pulse width of the $i^{th}$ charging control signal, and the foregoing electronic device obtains the $i^{th}$ charging control signal in a one-to-one correspondence with the $i^{th}$ laser based on the pulse width of the $i^{th}$ charging control signal, so that the $i^{th}$ optical power is equal to the target optical power. For example, there is the foregoing mapping relationship between the $i^{th}$ laser identifier and the pulse width (or a pulse width identifier).

In addition, the main control unit 420 may be further configured to generate a pulse parameter configuration table based on the mapping relationship and the pulse width, and the foregoing electronic device generates the $i^{th}$ control signal in a one-to-one correspondence with the $i^{th}$ laser based on the pulse parameter configuration table, so that the $i^{th}$ optical power is equal to the target optical power. For example, there is the foregoing mapping relationship between the $i^{th}$ laser identifier and the $i^{th}$ control signal identifier.

In some embodiments, in consideration that a photoelectric parameter such as rated optical power of the laser may change. For example, optical power of a semiconductor laser may gradually decrease with prolonging of use time due to a reason such as aging. In addition, change laws of the optical power of different lasers may vary, which may cause deterioration of optical power uniformity of a calibrated laser array.

In this embodiment, the foregoing mapping relationship, pulse parameter configuration table or the like may be updated through regular automatic triggering, manual triggering or the like, to solve the foregoing problem. Specifically, when the $i^{th}$ optical power is not equal to the target optical power, the $i^{th}$ laser obtains the adjusted $i^{th}$ control signal until the $i^{th}$ optical power is equal to the target optical power. The main control unit updates the mapping relationship based on the adjusted $i^{th}$ control signal.

Herein, to determine whether the $i^{th}$ optical power is equal to the target optical power, the $i^{th}$ optical power can be directly collected through an independently set optical power meter for comparison with the target optical power. In addition, a photosensitive sensor integrated in the laser array can also be used to automatically collect optical power of each laser in a preset cycle, to facilitate comparison with the target optical power.

To update the mapping relationship based on real-time optical power of the laser, an embodiment of this application also provides an electronic device.

Figure 14:
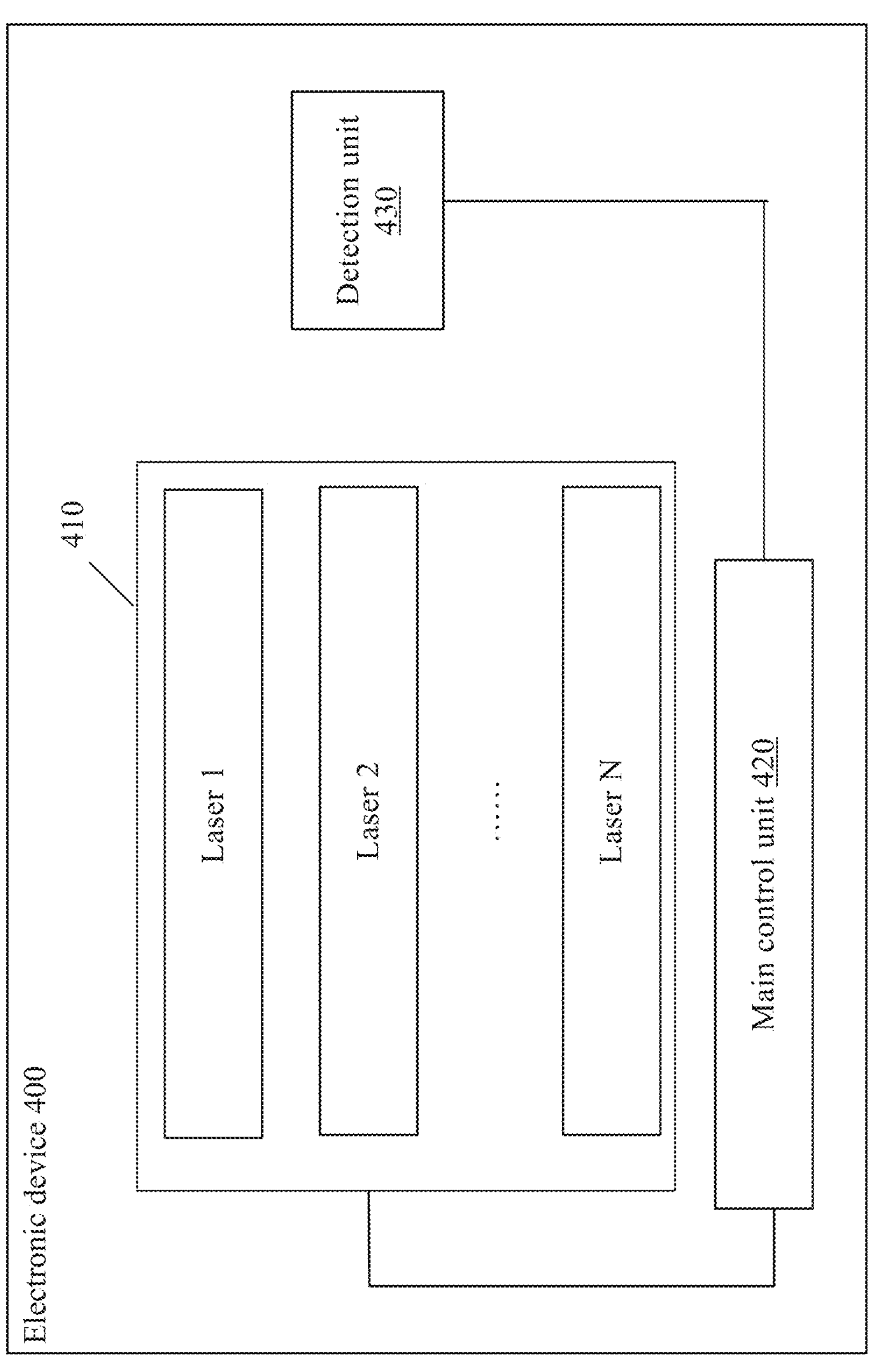
FIG. 14 is a schematic structural diagram of another framework of an electronic device according to an embodiment of this application.

FIG. 14 is another block diagram of an electronic device according to an embodiment of this application. Referring to FIG. 14, in this case, the electronic device 400 further includes a detection unit 430 in addition to a laser beam emission circuit 410 and a main control unit 420. The laser beam emission circuit 410 includes a two-dimensional laser array consisting of N lasers and the addressable drive circuit of the laser array. The addressable drive circuit of the laser array externally receives an addressing drive signal, and multiple lasers in the laser array are driven by scanning to perform addressing to emit laser beams. The main control unit 420 is configured with the mapping relationship provided by the foregoing calibration apparatus 300, and generates control signals in a one-to-one correspondence with the N lasers based on the mapping relationship; and optical power of the N lasers and the target optical power are equalized under the control of the control signals in a one-to-one correspondence with the N lasers. The detection unit 430 is configured to detect current optical power of the $i^{th}$ laser, and send a detection result to the main control unit 420.

Herein, the current optical power is optical power when the $i^{th}$ laser emits a laser beam under the control of the current $i^{th}$ control signal, where $N \geq i \geq 1$. Correspondingly, when the current optical power of the $i^{th}$ laser is not equal to the target optical power, the main control unit 420 is further configured to adjust the $i^{th}$ control signal based on a detection result of the detection unit 430, so that the $i^{th}$ optical power is equal to the target optical power when the $i^{th}$ laser emits a laser beam under the control of the adjusted $i^{th}$ control signal, where the main control unit 420 further updates the mapping relationship based on the adjusted $i^{th}$ control signal.

In an example, the detection unit 430 may use an optical power meter. The optical power meter is configured to collect a laser beam emitted by the laser, and further detect optical power of the laser during laser beam emission.

In an example, the main control unit 420 is configured to send charging control signals in a one-to-one correspondence to the energy storage-adjustable charging circuits through time-division, to ensure that luminous power of each laser in the two-dimensional laser array is equal to the target power.

In another exemplary solution, the main control unit 420 stores a pulse parameter configuration table, and the pulse parameter configuration table stores pulse widths for determining various charging control signals. The main control unit 420 is configured to configure the pulse width of the charging control signal based on the parameter configuration table, to output the charging control signals in a one-to-one correspondence with the lasers. The main control unit 420 is further configured to adjust the $i^{th}$ control signal based on a detection result of the detection unit 430, so that the $i^{th}$ optical power is equal to the target optical power when the $i^{th}$ laser emits a laser beam under the control of the adjusted $i^{th}$ control signal, where the main control unit 420 further updates the parameter configuration table based on the adjusted $i^{th}$ control signal.

Figure 15:
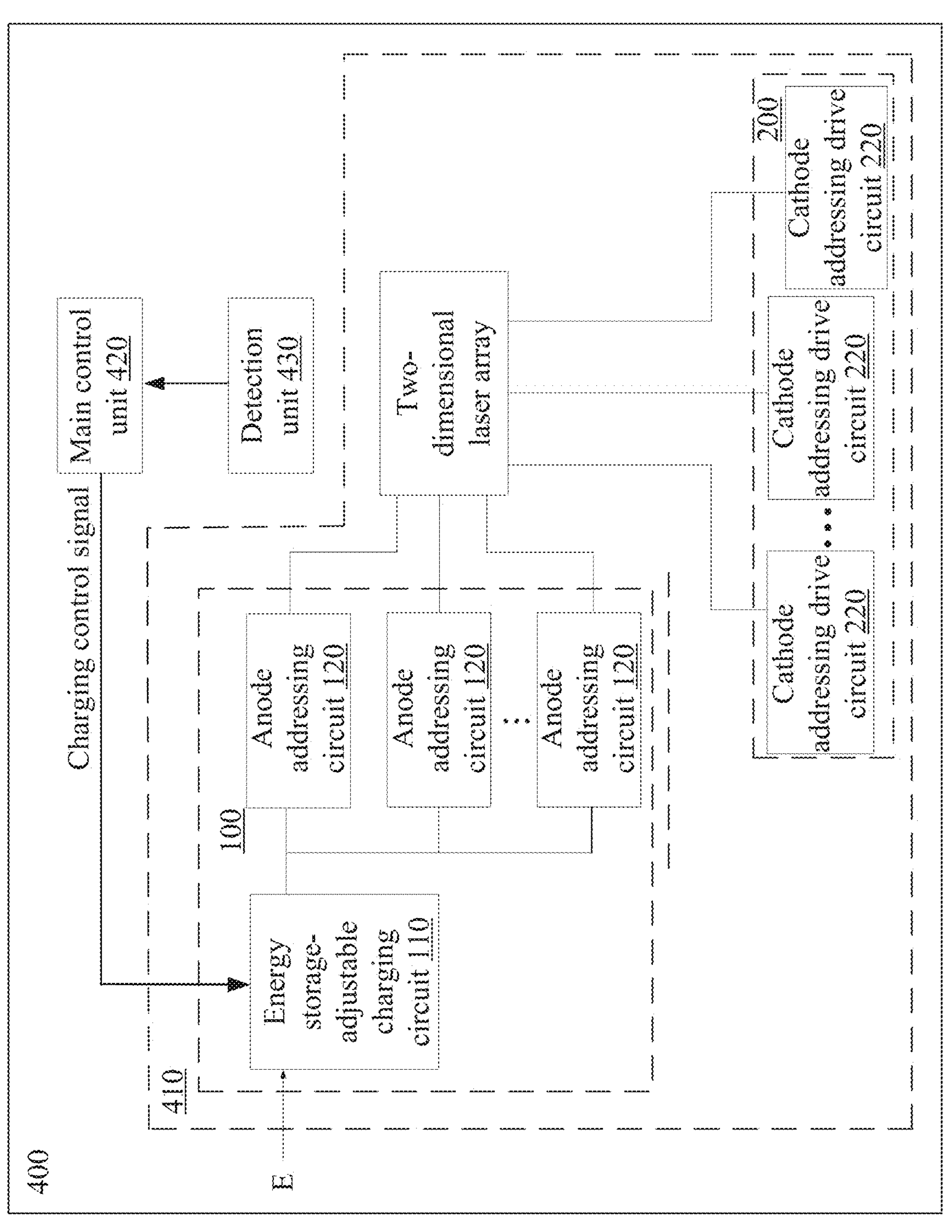
FIG. 15 is a schematic structural diagram of another framework of an electronic device according to an embodiment of this application.

To implement adaptive adjustment of optical power of the multiple lasers in the laser array, an embodiment of this application further provides another electronic device. Referring to FIG. 15, in this case, the electronic device 400 further includes a detection unit 430, in addition to a laser beam emission circuit 410 and a main control unit 420. The laser beam emission circuit 410 includes a two-directional laser array consisting of N lasers and an addressable drive circuit of the laser array. The addressable drive circuit of the laser array includes an anode addressable drive circuit 100 and a cathode addressable drive circuit 200. The anode addressable drive circuit 100 includes the foregoing energy storage-adjustable charging circuit 110 and multiple anode addressing drive circuits 120. The cathode addressable drive circuit includes multiple cathode addressing drive circuits 220. The multiple anode addressing drive circuits 120 are connected one-to-one to multiple shared anode ends corresponding to the multiple rows of lasers, and the multiple anode addressing drive circuits 120 externally receive an anode addressing signal, to drive anode addressing for the anodes of the multiple rows of lasers through scanning; and the multiple cathode addressing drive circuits 220 are connected one-to-one to the multiple shared cathode ends corresponding to the multiple columns of lasers, and then the multiple cathode addressing drive circuits 220 externally receive a cathode addressing signal, to drive cathode addressing for the cathodes of the multiple columns of lasers in the laser array through scanning. The detection unit 430 is configured to detect current optical power of the $i^{th}$ laser, and send a detection result to the main control unit 420. The main control unit 420 adjusts the charging control signal sent to the energy storage-adjustable charging circuit 110 based on the detection result of the detection unit 430, to enable the energy storage-adjustable charging circuit 110 to provide energy storage values in a one-to-one correspondence to multiple lasers in the laser arrays, so that the optical power of the multiple lasers in the laser array is equal to the target optical power.

Herein, the current optical power is the optical power when the $i^{th}$ laser is selected for laser beam emission. In this case, the energy storage-adjustable charging circuit 110 stores $i^{th}$ electric energy for the $i^{th}$ laser to emit the laser beam under the control of the $i^{th}$ charging control signal, where $N \geq i \geq 1$, so that the $i^{th}$ optical power is equal to the target optical power.

Another aspect of this application further provides a calibration method, the calibration method is applied to a laser beam emission circuit, the laser beam emission circuit uses N lasers to emit laser beams, and luminous power of the N lasers is controlled by using their respective control signals; and the calibration method provided in this application can calibrate the control signals of the N lasers in advance to improve optical power uniformity of the lasers.

Figure 16:
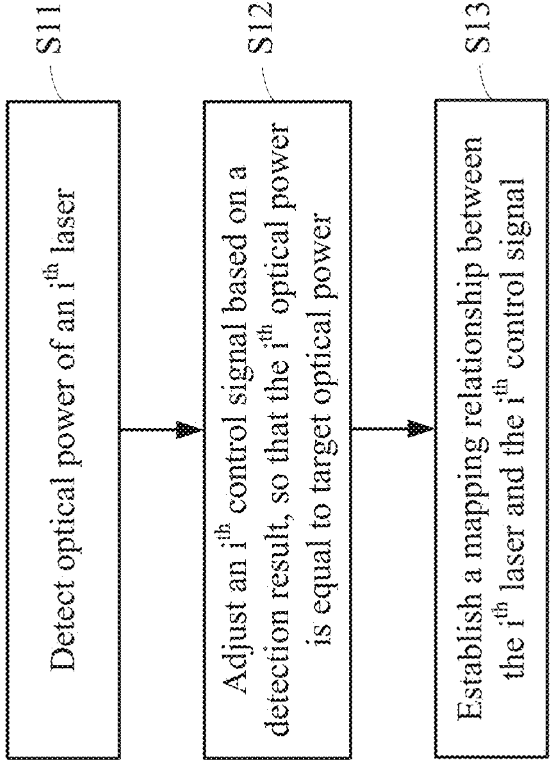
FIG. 16 is a flowchart of a calibration method according to an embodiment of this application.

Referring to FIG. 16, in an exemplary solution, the calibration method may include the following steps.

S110. Detect optical power of an $i^{th}$ laser, where i=1, 2, . . . , N.

S120. Adjust an $i^{th}$ control signal based on a detection result, so that $i^{th}$ optical power is equal to target optical power, where the $i^{th}$ control signal is used to control optical power of an $i^{th}$ laser during laser beam emission, and the $i^{th}$ optical power is optical power of the $i^{th}$ laser during laser beam emission.

S130. Establish a mapping relationship between the $i^{th}$ laser and the $i^{th}$ control signal when the $i^{th}$ optical power is equal to the target optical power.

Further, in an exemplary embodiment, the laser beam emission circuit includes at least one energy storage-adjustable charging circuit 110, and the N lasers emit laser beams by using the electric energy provided by the energy storage-adjustable charging circuit 110. Herein, an energy storage value of the energy storage-adjustable charging circuit 110 determines luminous power of the laser, and the energy storage value of the energy storage-adjustable charging circuit 110 corresponding to the N lasers during laser beam emission is adjusted in the calibration method, so that optical power of the N lasers is equal to the target optical power.

In this embodiment, the energy storage value of the energy storage-adjustable charging circuit 110 is controlled by using the charging control signal, and optical power of a specific laser can be adjusted by adjusting the charging control signal. The calibration method provided in this application can calibrate charging control signals corresponding to the N lasers, to improve optical power uniformity of the lasers.

Correspondingly, in step S120, the $i^{th}$ charging control signal is adjusted based on the detection result, so that the $i^{th}$ optical power is equal to target optical power. The $i^{th}$ charging control signal is used to control the energy storage-adjustable charging circuit 110 to store the $i^{th}$ electric energy when the $i^{th}$ laser is selected for laser beam emission, so that the $i^{th}$ optical power is equal to the target optical power. In step S130, when the $i^{th}$ optical power is equal to the target optical power, the mapping relationship is established between the $i^{th}$ laser and the $i^{th}$ charging control signal.

In some embodiments, the energy storage-adjustable charging circuit includes a charging switch element Q1. Correspondingly, adjusting the initial control signal so that the $i^{th}$ optical power output by the $i^{th}$ laser approaches the target optical power may include adjusting the initial control signal to change the turn-on duration of the charging switch element Q1, so that the energy storage-adjustable charging circuit stores the $i^{th}$ electric energy and the optical power of the $i^{th}$ laser approaches the target optical power when driven by the $i^{th}$ electric energy. In this way, the turn-on duration of the charging switch element Q1 can be controlled, to control electric energy stored by the energy storage-adjustable charging circuit.

In some embodiments, electric energy values of the initial electric energy and the $i^{th}$ electric energy are respectively positively correlated to the turn-on duration of the charging switch element Q1.

In some embodiments, either of the initial control signal and the $i^{th}$ control signal is a pulse signal, and the pulse width of the pulse signal is positively correlated to the turn-on duration of the charging switch element Q1.

In some embodiments, after establishing the mapping relationship between the $i^{th}$ laser and the $i^{th}$ control signal, the foregoing calibration method may further include generating a pulse parameter configuration table based on the mapping relationship and a pulse width, so that the $i^{th}$ control signal corresponding to the $i^{th}$ laser is determined based on the pulse parameter configuration table. In this way, $i^{th}$ is convenient to determine the $i^{th}$ control signal or the $i^{th}$ charging control signal corresponding to the $i^{th}$ laser based on the pulse parameter configuration table.

Figure 17:
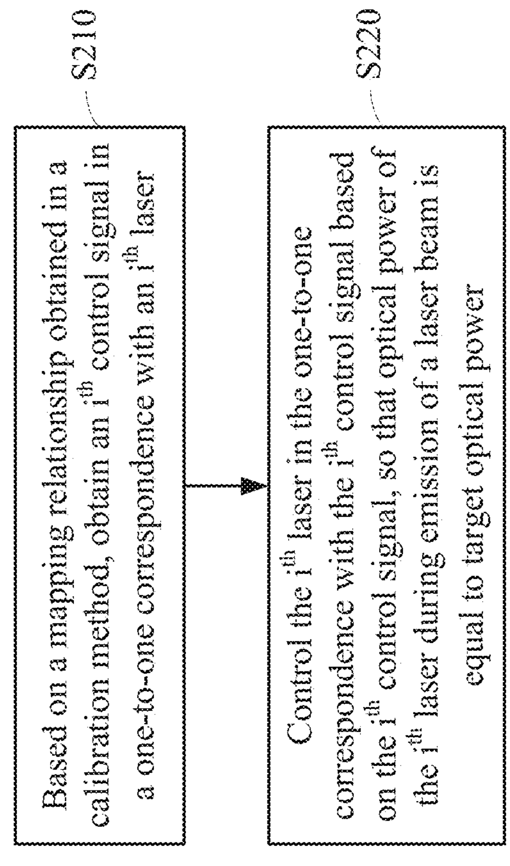
FIG. 17 is another flowchart of a calibration method according to an embodiment of this application.

Referring to FIG. 17, correspondingly, the laser beam emission method based on the foregoing calibration method includes the following steps.

S210. Based on a mapping relationship obtained in a calibration method, obtain an $i^{th}$ control signal in a one-to-one correspondence with an $i^{th}$ laser.

S220. Control the $i^{th}$ laser in the one-to-one correspondence with the $i^{th}$ control signal based on the $i^{th}$ control signal, so that optical power of the $i^{th}$ laser during emission of a laser beam is equal to target optical power.

Specifically, in an exemplary embodiment, the laser beam emission circuit includes at least one energy storage-adjustable charging circuit 110, and the N lasers emit laser beams by using the electric energy provided by the energy storage-adjustable charging circuit 110. Herein, an energy storage value of the energy storage-adjustable charging circuit 110 determines luminous power of the laser, and the energy storage value of the energy storage-adjustable charging circuit 110 corresponding to the N lasers during laser beam emission is preset in the laser beam emission method, so that optical power of the N lasers is equal to the target optical power.

In this embodiment, the energy storage value of the energy storage-adjustable charging circuit 110 is controlled by using the charging control signal, and optical power of a specific laser can be set by setting the charging control signal. In the laser beam emission method provided in this application, charging control signals corresponding to the N lasers can be prestored in the foregoing calibration method, to improve optical power uniformity of the lasers.

Correspondingly, in step S210, based on a mapping relationship provided in the foregoing calibration method, the $i^{th}$ charging control signal in the one-to-one correspondence with the $i^{th}$ laser is obtained, where the $i^{th}$ charging control signal is used to control the energy storage-adjustable charging circuit 110 to store the $i^{th}$ electric energy when the $i^{th}$ laser is selected for laser beam emission, so that the $i^{th}$ optical power is equal to the target optical power. In step S220, the $i^{th}$ charging control signal is used to control the energy storage-adjustable charging circuit 110 to store the $i^{th}$ electric energy, and the $i^{th}$ laser in the one-to-one correspondence is driven by the $i^{th}$ electric energy to emit a laser beam, so that optical power of the $i^{th}$ laser during laser beam emission is equal to the target optical power.

In some embodiments, determining the $i^{th}$ control signal corresponding to the $i^{th}$ laser based on the mapping relationship may include the following operations. Firstly, a pulse parameter corresponding to the $i^{th}$ laser is determined based on the pulse parameter configuration table, where the pulse parameter configuration table includes a correspondence between the $i^{th}$ laser and the pulse parameter. Then, the $i^{th}$ control signal is generated based on the pulse parameter.

In some embodiments, controlling the optical power of the $i^{th}$ laser based on the $i^{th}$ control signal includes individually sending the $i^{th}$ control signal to the energy storage-adjustable charging circuit through time-division, so that the energy storage-adjustable charging circuit stores $i^{th}$ electric energy to output the $i^{th}$ electric energy to the $i^{th}$ laser, to enable the $i^{th}$ laser to output the $i^{th}$ optical power. In this way, one-to-one time-dividing control can be implemented.

In some embodiments, adaptive adjustment of luminous power in this embodiment can also be implemented. Specifically, a method for controlling the luminous power may include the following operations.

Firstly, current optical power of the $i^{th}$ laser is determined, where the current optical power is optical power of a laser beam of the $i^{th}$ laser corresponding to the current control signal, and $N \geq i \geq 1$.

Then, the current optical power is compared with the target optical power to obtain an optical power difference.

Next, the $i^{th}$ control signal corresponding to the $i^{th}$ laser is determined based on the optical power difference.

Then, the $i^{th}$ laser is controlled to use the $i^{th}$ optical power for emission based on the $i^{th}$ control signal.

Herein, the $i^{th}$ control signal is the same as or different from the current control signal, the second optical power uniformity is better than or equivalent to the first optical power uniformity, the first optical power uniformity is optical power uniformity of current optical power of each of the N lasers, and the second optical power uniformity is the optical power uniformity of the $i^{th}$ optical power of each of the N lasers.

In some embodiments, the current control signal is the current charging control signal, and the $i^{th}$ control signal is the $i^{th}$ charging control signal.

Correspondingly, the current charging control signal is used to control the energy storage-adjustable charging circuit to store the current electric energy, to output the current electric energy to the $i^{th}$ laser, so that the $i^{th}$ laser outputs the current optical power. The $i^{th}$ control signal is used to control the energy storage-adjustable charging circuit to store the $i^{th}$ electric energy, to output the $i^{th}$ electric energy to the $i^{th}$ laser, so that the its optical power output by the $i^{th}$ laser is equal to the target optical power.

In an exemplary solution, the foregoing electronic device may be a LiDAR, and the LiDAR generates a laser beam through the foregoing laser beam emission circuit, emits the laser beam toward a detection region, and then cooperates with a laser receiving device in the LiDAR. An echo beam reflected from a target is received by the laser receiving device, and then data is properly processed by a signal processing system, to obtain information such as distance, speed, azimuth, attitude, and even shape of the target, which can be applied to navigation avoidance, obstacle recognition, ranging, speed measurement, autonomous driving, and other scenarios of an automobile, a robot, a logistics vehicle, a patrol vehicle, and other products.

Another aspect of this application also provides an electronic device. The electronic device may include a memory and a processor. In addition, multiple lasers can also be provided on the electronic device. The processor may be a central processing unit (CPU), or may be another general-purpose processor, a digital signal processor (DSP), an application specific integrated circuit (ASIC), a field-programmable gate array (FPGA) or another programmable logic device, a discrete gate or transistor logic device, a discrete hardware component, or the like. The general-purpose processor may be a microprocessor, or the processor may be any conventional processor or the like. The memory may include various types of storage units such as a system memory, a read-only memory (ROM), and persistent storage. An executable program is stored in the memory, and when the executable program is processed by the processor, the processor can execute at least a part of the foregoing method.

In addition, the method according to this application can also be implemented as a computer program or a computer program product, where the computer program or the computer program product includes a computer program code instruction for executing some or all of the steps in the foregoing method in this application. Alternatively, this application may be implemented as a computer-readable storage medium (or a non-transitory machine-readable storage medium or a machine-readable storage medium) storing an executable program (or a computer program or a computer instruction code), and when the executable program is executed by a processor (a server, or the like) of the electronic device, the processor executes some or all of the steps in the foregoing method in this application.

What is claimed is:

1. A calibration apparatus for a laser beam emission circuit, wherein the laser beam emission circuit comprises N lasers, where N is a positive integer greater than or equal to 2, the calibration apparatus comprising:

a detection module, configured to detect optical power of an $i^{th}$ laser; and a control module, configured to adjust an $i^{th}$ control signal based on a detection result of the detection module, so that $i^{th}$ optical power is equal to target optical power, wherein N≥i≥1, the $i^{th}$ control signal is for controlling optical power of the $i^{th}$ laser during laser beam emission, and the $i^{th}$ optical power is optical power of the $i^{th}$ laser during laser beam emission, and the control module is further configured to establish a mapping relationship between the $i^{th}$ laser and the $i^{th}$ control signal when the $i^{th}$ optical power is equal to the target optical power, wherein the N lasers emit laser beams by using electric energy provided by at least one energy storage-adjustable charging circuit, the $i^{th}$ control signal is an $i^{th}$ charging control signal for controlling the energy storage-adjustable charging circuit to store $i^{th}$ electric energy, wherein the $i^{th}$ electric energy is configured to provide energy for the $i^{th}$ laser to emit a laser beam, and the control module is configured to adjust the $i^{th}$ electric energy by using the $i^{th}$ charging control signal, so that the $i^{th}$ optical power is equal to the target optical power; and the energy storage-adjustable charging circuit comprises a charging switch element and a transitory energy storage element, wherein the charging switch element is connected between an emission power supply and the transitory energy storage element, and when the charging switch element is turned on, the transitory energy storage element is configured to store electric energy by using the emission power supply; and the control module is configured to adjust turn-on duration of the charging switch element by using the $i^{th}$ charging control signal, to adjust a level of the $i^{th}$ electric energy, so that the $i^{th}$ optical power is equal to the target optical power, wherein the $i^{th}$ charging control signal is a pulse signal, and the turn-on duration of the charging switch element is related to a pulse width of the $i^{th}$ charging control signal;

the mapping relationship established by the control module is a mapping relationship between the $i^{th}$ laser and the pulse width of the $i^{th}$ charging control signal, and an electronic device obtains the $i^{th}$ charging control signal in a one-to-one correspondence with the $i^{th}$ laser based on the pulse width of the $i^{th}$ charging control signal, so that the $i^{th}$ optical power is equal to the target optical power; or the control module is further configured to generate a pulse parameter configuration table based on the mapping relationship and the pulse width, and the electronic device generates the $i^{th}$ control signal in a one-to-one correspondence with the $i^{th}$ laser based on the pulse parameter configuration table, so that the $i^{th}$ optical power is equal to the target optical power.

2. The calibration apparatus according to claim 1, wherein the N lasers are disposed in an array, a same row of multiple lasers in the N lasers are connected through a shared anode end, multiple rows of lasers are respectively connected to the energy storage-adjustable charging circuit through the shared anode ends in a one-to-one correspondence with the multiple rows of lasers, the energy storage-adjustable charging circuit is configured to provide electric energy for a laser selected for laser beam emission, and the energy storage-adjustable charging circuit is configured to store, for the $i^{th}$ laser, the $i^{th}$ electric energy in a one-to-one correspondence with the $i^{th}$ laser based on the mapping relationship, so that the $i^{th}$ optical power is equal to the target optical power.

3. A laser beam emission circuit, comprising N lasers and is configured to obtain an $i^{th}$ control signal in a one-to-one correspondence with an $i^{th}$ laser based on the mapping relationship provided by the calibration apparatus according to claim 1, so that optical power of the $i^{th}$ laser during laser beam emission is equal to target optical power, wherein N≥i≥1.

* * * * *